United States Patent
Takahashi et al.

(10) Patent No.: US 8,425,974 B2
(45) Date of Patent: Apr. 23, 2013

(54) EVAPORATION DONOR SUBSTRATE AND METHOD FOR MANUFACTURING LIGHT-EMITTING DEVICE

(75) Inventors: Rena Takahashi, Kanagawa (JP); Yosuke Sato, Kanagawa (JP); Kohei Yokoyama, Kanagawa (JP); Tomoya Aoyama, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 778 days.

(21) Appl. No.: 12/272,034

(22) Filed: Nov. 17, 2008

(65) Prior Publication Data

US 2009/0142510 A1 Jun. 4, 2009

(30) Foreign Application Priority Data

Nov. 29, 2007 (JP) .................... 2007-308606

(51) Int. Cl.
*B05D 5/12* (2006.01)
*B41M 5/40* (2006.01)

(52) U.S. Cl.
USPC .......... 427/66; 427/555; 427/407.1; 430/200; 428/32.6

(58) Field of Classification Search .......... 427/555, 427/586, 596, 66, 70, 75, 152, 69
See application file for complete search history.

(56) References Cited

U.S. PATENT DOCUMENTS

| | | | |
|---|---|---|---|
| 4,752,455 A | * | 6/1988 | Mayer ..................... 427/597 |
| 5,851,709 A | * | 12/1998 | Grande et al. ................. 430/7 |
| 5,937,272 A | | 8/1999 | Tang |
| 6,165,543 A | | 12/2000 | Otsuki et al. |
| 6,283,060 B1 | | 9/2001 | Yamazaki et al. |
| 6,566,032 B1 | | 5/2003 | Boroson et al. |
| 6,610,455 B1 | | 8/2003 | Burberry et al. |
| 6,689,492 B1 | | 2/2004 | Yamazaki et al. |

(Continued)

FOREIGN PATENT DOCUMENTS

| | | |
|---|---|---|
| EP | 0 913 870 A2 | 5/1999 |
| JP | 11-237504 | 8/1999 |

(Continued)

OTHER PUBLICATIONS

Urabe, T. et al, "13.1: Invited Paper: Technological Evolution for Large Screen Size Active Matrix OLED Display," SID '07 Digest: SID International Symposium Digest of Technical Papers, vol. 38, book 1, May 2007, pp. 161-164.

*Primary Examiner* — Dah-Wei Yuan
*Assistant Examiner* — Jose Hernandez-Diaz
(74) *Attorney, Agent, or Firm* — Husch Blackwell LLP

(57) ABSTRACT

A first supporting substrate on a front surface of which a reflective layer having an opening is formed and a second supporting substrate on a front surface of which a light absorption layer patterned into island or stripe shapes and a material layer over the light absorption layer are formed are prepared, the first and second supporting substrates are disposed so that the opening of the reflective layer and the light absorption layer overlap with each other and the reflective layer is in contact with a back surface of the second supporting substrate, the second supporting substrate and a deposition target substrate are disposed so that the front surface of the second supporting substrate faces the deposition target substrate, and the material layer is attached to the deposition target substrate by irradiating the back surface of the first supporting substrate with light and by sublimating the material layer.

36 Claims, 15 Drawing Sheets

U.S. PATENT DOCUMENTS

| | | |
|---|---|---|
| 6,695,029 B2 | 2/2004 | Phillips et al. |
| 6,703,179 B2 | 3/2004 | Tyan |
| 6,776,847 B2 | 8/2004 | Yamazaki et al. |
| 6,811,938 B2 | 11/2004 | Tutt et al. |
| 7,223,514 B2 | 5/2007 | Kang et al. |
| 7,316,983 B2 | 1/2008 | Yamazaki et al. |
| 7,674,749 B2 | 3/2010 | Kang et al. |
| 7,691,783 B2 | 4/2010 | Matsuda et al. |
| 7,887,987 B2 | 2/2011 | Matsuo |
| 2004/0065902 A1 | 4/2004 | Yamazaki et al. |
| 2004/0191564 A1 | 9/2004 | Kim et al. |
| 2005/0005848 A1 | 1/2005 | Yamazaki et al. |
| 2005/0145326 A1 | 7/2005 | Hatwar |
| 2006/0243377 A1 | 11/2006 | Matsuo et al. |
| 2006/0246240 A1* | 11/2006 | Matsuda et al. ............ 428/32.39 |
| 2008/0026543 A1 | 1/2008 | Miyairi et al. |
| 2008/0081115 A1 | 4/2008 | Yamazaki et al. |
| 2008/0113292 A1 | 5/2008 | Matsuo |
| 2009/0075214 A1* | 3/2009 | Hirakata et al. ............... 430/319 |
| 2009/0104403 A1 | 4/2009 | Aoyama et al. |
| 2009/0104835 A1 | 4/2009 | Aoyama et al. |

FOREIGN PATENT DOCUMENTS

| | | |
|---|---|---|
| JP | 2000-256877 | 9/2000 |
| JP | 2003-313654 | 11/2003 |
| JP | 2004-103406 | 4/2004 |
| JP | 2004-303528 | 10/2004 |
| JP | 2004-303529 | 10/2004 |
| JP | 2005-85830 | 3/2005 |
| JP | 2006-309994 | 11/2006 |
| JP | 2006-309995 | 11/2006 |
| WO | WO 2005/069398 A2 | 7/2005 |

* cited by examiner

B-B' cross section

A-A' cross section

EVAPORATION DONOR SUBSTRATE AND METHOD FOR MANUFACTURING LIGHT-EMITTING DEVICE

BACKGROUND OF THE INVENTION

1. Field of the Invention

The present invention relates to light-emitting devices and methods of manufacturing the light-emitting devices. The present invention also relates to evaporation donor substrates which are used for deposition of a material which can be deposited onto a substrate.

2. Description of the Related Art

Organic compounds can take various structures compared with inorganic compounds, and it is possible to synthesize materials having various functions by appropriate molecular design. Because of these advantages, photo electronics and electronics which utilize functional organic materials have been attracting attention in recent years.

Solar cells, light-emitting elements, organic transistors, and the like are given as examples of electronics devices using an organic compound as a functional organic material. These devices take advantage of electrical properties and optical properties of the organic compound. Among them, in particular, light-emitting elements have been making remarkable progress.

A light emission mechanism of a light emitting element is described below: when voltage is applied between a pair of electrodes with an electroluminescence (hereinafter, also referred to as EL) layer interposed therebetween, electrons injected from a cathode and holes injected from an anode are recombined at an emission center in the EL layer to form molecular excitons, and energy is released when the molecular excitons relax to the ground state and thus light is emitted. As excited states, a singlet excited state and a triplet excited state are known, and light emission is possible through either of these excited states.

An EL layer included in a light emitting element has at least a light emitting layer. The EL layer can have a stacked-layer structure including a hole-injecting layer, a hole-transporting layer, an electron-transporting layer, an electron-injecting layer, and/or the like in addition to the light emitting layer.

EL materials for forming an EL layer are broadly classified into a low molecular (a monomer) material and a high molecular (a polymer) material. In general, a film of a low molecular material is often formed with an evaporation apparatus and a film of a high molecular material is often formed by an inkjet method or the like. A conventional evaporation apparatus has a substrate holder on which a substrate is placed, a crucible (or an evaporation boat) containing an EL material, that is, an evaporation material, a heater for heating the EL material in the crucible, and a shutter for preventing the EL material from being scattered during sublimation. The EL material which is heated by the heater is sublimated and deposited onto the substrate. At this time, in order to achieve uniform deposition, a deposition target substrate needs to be rotated, and the distance between the substrate and the crucible needs to be about 1 m even for a 300 mm by 360 mm substrate.

In the case of manufacturing a full-color flat panel display using emission colors of red, green, and blue by the above method, a metal mask is provided between the substrate and an evaporation source so as to be in contact with the substrate. Selective coloring can be achieved with this mask. However, this method does not provide very highly accurate deposition and thus requires that the distance between pixels be designed to be large and that the width of a partition wall (a bank) formed of an insulator between pixels be large. Therefore, application of the method to a high-definition display device is difficult.

In addition, demands for higher definition, higher aperture ratio, and higher reliability of a full-color flat panel display using emission colors of red, green, and blue have been increasing. Such demands are major issues in advancing miniaturization of display pixel pitches, which is associated with improvement in definition (an increase in the number of pixels) and a reduction in size of a light-emitting device. At the same time, demands for more productivity and lower cost have also been increasing.

Thus, a method of forming an EL layer of a light-emitting element by laser thermal transfer has been proposed (see Reference 1: Japanese Published Patent Application No. 2006-309994). Reference 1 describes a method for forming an EL layer in which a transfer substrate including a transfer layer formed over a supporting substrate with a photothermal conversion layer therebetween and an element-forming substrate are disposed to face each other, and the transfer layer is transferred to the element-forming substrate by irradiation of the transfer substrate with laser light (hereinafter, also referred to as a laser beam).

In addition, reference 1 discloses a method for improving the use efficiency of the transfer layer provided over the transfer substrate in such a manner that the transfer substrate after transfer of the transfer layer to the element-forming substrate is used again for transfer to another element-forming substrate.

SUMMARY OF THE INVENTION

However, in the transfer substrate in reference 1, a region corresponding to one pixel is selectively irradiated with laser to be transferred; therefore, highly accurate laser irradiation is required. In addition, even if laser light is delivered with high accuracy, a region to which the transfer layer is transferred may spread due to heat conduction in the photothermal conversion layer.

Further, in a structure of FIG. 10 in reference 1, heat from a heat source is added to the entire surface of the transfer substrate through a blocking mask having an opening, whereby a part of the transfer layer corresponding to the opening of the blocking mask is transferred to the element-forming substrate. Even with this structure, heat may be conducted in a surface direction in the photothermal conversion layer, whereby not only a desired part of the transfer layer but also a part therearound is transferred. In addition, the blocking mask which is irradiated with laser light is expanded by heat of the laser light and warped; therefore, an EL layer cannot be formed accurately.

Accordingly, one of the objects of the present invention is to provide a method for manufacturing a light-emitting device and an evaporation donor substrate with which higher definition (an increase in the number of pixels) and miniaturization of display pixel pitches along with downsize of the light-emitting device can be advanced. In addition, it is another object of the present invention to provide a method for manufacturing a light-emitting device in which an EL layer is deposited accurately.

In addition, it is another object of the present invention to provide a method for manufacturing a light-emitting device with low manufacturing cost in the case of manufacturing a full-color flat panel display using emission colors of red, green, and blue.

An evaporation donor substrate according to one aspect of the present invention includes a reflective layer having an opening which is formed over a first supporting substrate; a second supporting substrate disposed so that its back surface is in contact with the reflective layer; a light absorption layer on a front surface of the second supporting substrate; and a material layer over the light absorption layer; in which the light absorption layer is patterned into an island or stripe shape, and the first and second supporting substrates are disposed so that the opening of the reflective layer and the light absorption layer overlap with each other.

In the foregoing structure, one opening of the reflective layer is provided for every N (N is an integer of two or more) patterns of the light absorption layer. Preferably, one opening of the reflective layer is provided for every three patterns of the light absorption layer.

In addition, in the foregoing structure, the first supporting substrate and the second supporting substrate have the same coefficient of thermal expansion. Further, the first supporting substrate and the second supporting substrate are preferably formed of materials having the same properties.

A method for manufacturing a light-emitting device according to one aspect of the present invention includes preparing a first supporting substrate on a front surface of which a reflective layer having an opening is formed and a second supporting substrate on a front surface of which a light absorption layer patterned into an island or stripe shape and a material layer over the light absorption layer are formed; disposing the first and second supporting substrates so that the opening of the reflective layer and the light absorption layer overlap with each other and the reflective layer is in contact with a back surface of the second supporting substrate; disposing the second supporting substrate and a deposition target substrate so that a front surface of the second supporting substrate faces the deposition target substrate; and forming an EL layer over the deposition target substrate by irradiating the back surface of the first supporting substrate with light and by heating the material layer.

A method for manufacturing a light-emitting device according to one aspect of the present invention includes a step of preparing a first supporting substrate on a front surface of which a reflective layer having an opening is formed and a second supporting substrate on a front surface of which a light absorption layer patterned into an island or stripe shape and having at least a first region and a second region and a material layer over the light absorption layer are formed; a first transferring step in which the first and second supporting substrates are disposed so that the opening of the reflective layer and the first region of the light absorption layer overlap with each other and the reflective layer is in contact with a back surface of the second supporting substrate, the second supporting substrate and a deposition target substrate are disposed so that the front surface of the second supporting substrate faces the deposition target substrate, and a back surface of the first supporting substrate is irradiated with light and a part of the material layer which is in contact with the first region of the light absorption layer is heated and evaporated onto the deposition target substrate; and a second transferring step in which the first and second supporting substrates are disposed so that the opening of the reflective layer and the second region of the light absorption layer overlap with each other and the reflective layer is in contact with the back surface of the second supporting substrate, the second supporting substrate and the deposition target substrate are disposed so that the front surface of the second supporting substrate faces the deposition target substrate, and the back surface of the first supporting substrate is irradiated with light and a part of the material layer which is in contact with the second region of the light absorption layer is heated and evaporated onto the deposition target substrate.

In the foregoing methods for manufacturing a light-emitting device according to one aspect of the present invention, one opening of the reflective layer is provided for every N (N is an integer of two or more) patterns of the light absorption layer. Preferably, one opening of the reflective layer is provided for every three patterns of the light absorption layer.

In addition, the foregoing method for manufacturing a light-emitting device according to one aspect of the present invention, the first supporting substrate, the second supporting substrate, and the deposition target substrate have the same coefficient of thermal expansion. Further, the first supporting substrate, the second supporting substrate, and the deposition target substrate are preferably formed of materials having the same properties.

Note that in this specification, a transferring step includes a step of disposing a first supporting substrate and a second supporting substrate which are included in an evaporation donor substrate, a step of disposing the evaporation donor substrate and a deposition target substrate, and a step of irradiating the evaporation donor substrate with light to heat a material layer of the evaporation donor substrate and to deposit an EL layer onto the deposition target substrate.

Note that terms of degrees which are used in this specification, for example, "same" means a reasonable amount of deviation from the modified term such that the end result is not significantly changed. These terms should be construed as including a deviation of at least ±5% of the modified term if this deviation would not negate the meaning of the word it modifies.

According to the present invention, accuracy of patterning of an EL layer is heightened in formation of the EL layer over a deposition target substrate. Accordingly, a light-emitting device with excellent characteristics can be obtained.

In addition, according to the present invention, manufacturing cost of the light-emitting device can be reduced.

DETAILED DESCRIPTION OF THE INVENTION

Figure 1A:
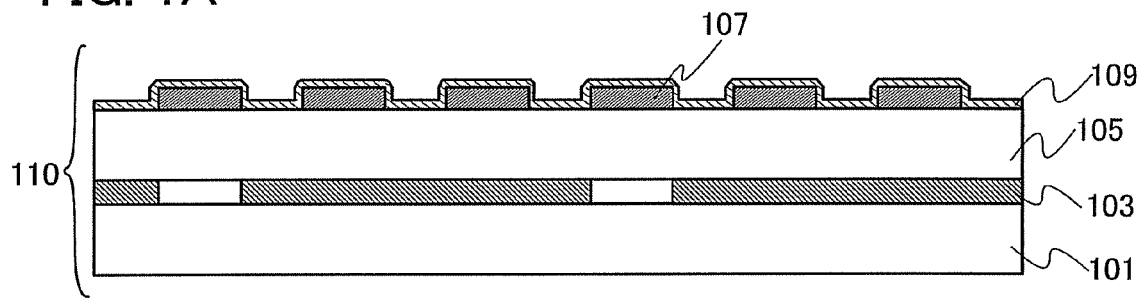
FIGS. 1A to 1C are schematic views illustrating cross sections in a deposition step according to an aspect of the present invention.

Hereinafter, embodiment modes of the present invention are described with reference to the accompanying drawings. Note that the present invention is not limited to the description below and it will be readily appreciated by those skilled in the art that modes and details can be modified in various ways without departing from the spirit and the scope of the present invention. Therefore, the present invention is not construed as being limited to the description of the embodiment modes given below. Note that in the structure of the present invention described below, the same reference numerals may be used to denote the same components among different drawings.

(Embodiment Mode 1)

An evaporation donor substrate and a method for manufacturing a light-emitting device according to the present invention are described with reference to FIGS. 1A to 1C and FIGS. 2A and 2B.

FIG. 1A illustrates an evaporation donor substrate 110 according to the present invention. In FIG. 1A, a reflective layer 103 is formed on a surface of a first supporting substrate 101. The reflective layer 103 includes island-shaped or stripe-shaped openings. In addition, the reflective layer 103 and a second supporting substrate 105 are disposed so that the reflective layer 103 and a back surface of the second supporting substrate 105 are in contact with each other. A light absorption layer 107 which is patterned into island or stripe shapes is formed on a front surface of the second supporting substrate 105. In addition, a material layer 109 is formed over the light absorption layer 107. In FIG. 1A, the material layer 109 is formed so as to cover the entire surface of the second supporting substrate 105.

The first supporting substrate 101 is a supporting substrate for the reflective layer 103 and transmits irradiation light for heating the material layer in a manufacturing process of a light-emitting device. Therefore, the first supporting substrate 101 preferably has high light transmittance. Specifically, when lamp light or laser light is used in order to evaporate the material layer 109, a substrate that transmits the light is preferably used as the first supporting substrate 101. As the first supporting substrate, for example, a glass substrate, a quartz substrate, a plastic substrate containing an inorganic glass, or the like can be used.

The reflective layer 103 reflects irradiation light for heating the material layer 109 so that heat needed for evaporation is not added to a part of the material layer 109 which is disposed in a region overlapping with the reflective layer 103 in a manufacturing process of a light-emitting device. The reflective layer 103 is preferably formed of a material having a high reflectance for the irradiation light, preferably the reflective layer 103 has a reflectance of 85% or more, more preferably a reflectance of 90% or more for the irradiation light. For example, in the case where the irradiation light is light in the infrared region at a wavelength of 800 nm to 2500 nm, silver, gold, platinum, copper, aluminum, an alloy containing aluminum, an alloy containing silver, or the like can be used as a material of the reflective layer 103. In particular, an aluminum-titanium alloy, an aluminum-neodymium alloy, and a silver-neodymium alloy have a high reflectance for light in the infrared region (at a wavelength of 800 nm or more) and are thus suitably used for the reflective layer. For example, an aluminum-titanium alloy film having a thickness of 400 nm has a reflectance of 85% or more for light in the infrared region (at a wavelength of 800 nm or more and 2500 nm or less) and in particular, a reflectance of 90% or more for light in the region at a wavelength of 900 nm or more and 2500 nm or less. Note that the kind of material suitable for the reflective layer 103 varies depending on the wavelength of light with which the first supporting substrate 101 is irradiated. The reflective layer is not limited to a single layer and may include a plurality of layers.

It is more preferable that the reflective layer 103 be formed of a material with low thermal conductivity. By using a material with low thermal conductivity, a minute pattern of an EL layer can be formed over the deposition target substrate.

The reflective layer 103 is not limited to a single layer and may include a plurality of layers. For example, the reflective layer may be a stack of a film formed of a material with a high reflectance and a film formed of a material with low thermal conductivity.

The reflective layer 103 can be formed by any of a variety of methods. For example, the reflective layer 103 can be formed by a sputtering method, an electron beam evaporation method, a vacuum evaporation method, or the like. In addition, the thickness of the reflective layer is preferably about 100 nm or more and 2 µm or less although it depends on a material. By being formed with a thickness of 100 nm or more, the reflective layer can suppress transmission of the irradiation light.

Although any of variety of methods can be employed for forming the opening of the reflective layer 103, dry etching is preferably employed. By dry etching, the opening has near vertical sidewalls, and thus a minute pattern can be formed.

The second supporting substrate 105 is a supporting substrate for the light absorption layer 107 and the material layer 109, and transmits the irradiation light for heating the material layer 109 in a manufacturing process of a light-emitting device. Therefore, the second supporting substrate 105 preferably has high light transmittance. Specifically, when a lamp or a laser is used as a light source for evaporating the material layer 109, a substrate that transmits the light is preferably used as the second supporting substrate 105. In addition, the second supporting substrate 105 is preferably formed of a material with low thermal conductivity. By using a material with low thermal conductivity, even if the reflective layer 103 over the first supporting substrate 101 is heated, heat conduction to the light absorption layer 107 through the second supporting substrate 105 which is in contact with the reflective layer 103 can be suppressed, and thus a part of the material layer 109 which is in a region overlapping with the reflective layer 103 can be prevented from being heated and evaporated. As the second supporting substrate, for example, a glass substrate, a quartz substrate, a plastic substrate containing an inorganic glass, or the like can be used.

The light absorption layer 107 is a layer for absorbing the irradiation light for heating the material layer 109, and converts the irradiation light to heat in a manufacturing process of a light-emitting device. The light absorption layer 107 is preferably formed of a material with a reflectance of as low as 70% or less and with high absorptance for the irradiation light. In addition, the light absorption layer 107 is preferably formed of a material with high thermal stability so as not to be decomposed by heat. The light absorption layer 107 is not limited to a single layer and may include a plurality of layers. The light absorption layer 107 is disposed in a region overlapping with the opening of the reflective layer 103. Further, the light absorption layer 107 is preferably formed into a pattern having approximately the same size as a pixel which is formed over the deposition target substrate because light transmitted through the opening of the reflective layer is absorbed by the light absorption layer 107 to heat a part of the material layer 109 which is in contact with the light absorption layer 107. Note that in the case where the light absorption layer 107 is formed into stripe shapes, it is preferable that the width of the pixel which is formed over the deposition target substrate is approximately the same as the width of the light absorption layer 107.

One opening of the reflective layer 103 is preferably provided for every N (N is an integer of two or more) patterns of the light absorption layer 107, more preferably one opening of the reflective layer 103 is provided for every three patterns of the light absorption layer 107. By providing one opening of the reflective layer 103 for every N patterns of the light absorption layer 107, through N times of transferring steps, parts of the material layer 109 which are located on first to N-th regions of the light absorption layer 107 are heated; accordingly, the parts of the material layer 109 which are located on all of the first to N-th regions of the light absorption layer 107 can be transferred to the deposition target substrate 201. For example, in the case where one opening of the reflective layer 103 is provided for every three patterns of the light absorption layer 107, parts of the material layer 109 which are located on first to third regions of the light absorption layer 107 can be transferred to the deposition target substrate 201 through three transferring steps.

In addition, by providing one opening of the reflective layer 103 for every three patterns of the light absorption layer 107, the material layers can be transferred to the deposition target substrate at intervals of two pixels through one transferring steps. This is effective in manufacturing a display device capable of full-color display using the deposition target substrate. In this embodiment mode, a process in which a deposition target substrate for full-color display is manufactured using an evaporation donor substrate in which one opening of the reflective layer 103 is provided for every three patterns of the light absorption layer 107 is described as an example.

The kind of material suitable for the light absorption layer 107 is different depending on the wavelength of the irradiation light for heating the material layer. For example, for light at a wavelength of 800 nm, molybdenum, tantalum nitride, titanium, tungsten, or the like is preferably used. In addition, for light at a wavelength of 1300 nm, tantalum nitride, titanium, or the like is preferably used.

Note that, for example, a molybdenum film and a tungsten film having a thickness of 400 nm has a reflectance of 60% or less for light at a wavelength of 800 nm or more and 900 nm or less and therefore can be suitably used as the light absorption layer. In addition, a molybdenum film and a tungsten film having a thickness of 400 nm has a reflectance of 85% or more for light at a wavelength of 2000 nm to 2500 nm and therefore can be used as the reflective layer.

The light absorption layer 107 can be formed by any of a variety of methods. For example, the light absorption layer 107 can be formed by a sputtering method using a target of molybdenum, tantalum, titanium, tungsten, or the like, or an alloy thereof. In addition, the light absorption layer is not limited to a single layer and may include a plurality of layers.

For patterning the light absorption layer 107, any of a variety of methods can be employed but dry etching is preferable. By dry etching, the patterned light absorption layer 107 has near vertical sidewalls and thus a minute pattern can be formed.

The light absorption layer preferably has a thickness such that it does not transmit the irradiation light. The light absorption layer preferably has a thickness of 100 nm or more and 2 µm or less although it depends on a material. In particular, by being formed with a thickness of 200 nm or more and 600 nm or less, the light absorption layer 107 can efficiently absorb the irradiation light to generate heat.

Note that the light absorption layer 107 may partially transmit the irradiation light as long as the evaporation material contained in the material layer 109 is heated to a sublimation temperature. In the case where the light absorption layer partially transmits the irradiation light, a material that does not decompose even when irradiated with light is preferably used for the material layer 109.

Note that the greater the difference in reflectance between the reflective layer and the light absorption layer is, the more preferable it is. Specifically, the difference in reflectance for a wavelength of the irradiation light is preferably 25% or more, more preferably 30% or more.

The material layer 109 is a layer which is transferred by being heated. As the evaporation material contained in the material layer, a variety of materials can be given. The material layer 109 may contain plural kinds of materials. In addition, the material layer 109 may be a single layer or a stack of a plurality of layers. By stacking a plurality of layers containing evaporation materials, co-evaporation is possible. Note that in the case where the plurality of layers are stacked, the layers are preferably stacked so that an evaporation material having a lower decomposition temperature is contained in a layer closer to the second supporting substrate 105. Alternatively, the plurality of layers are preferably stacked so that an evaporation material having a lower evaporation temperature is contained in a layer closer to the second supporting substrate 105. Such a structure allows a plurality of material layers containing evaporation materials to be efficiently heated and evaporated. Note that the term "evaporation temperature" in this specification refers to a temperature at which a material is sublimated. In addition, the term "decomposition temperature" refers to a temperature at which a change is caused by the action of heat, in at least a part of the chemical formula representing the material.

The material layer 109 is formed by any of a variety of methods. For example, a dry method such as a vacuum evaporation method or a sputtering method can be used. Alternatively, a wet method such as a spin coating method, a spray coating method, an inkjet method, a dip coating method, a casting method, a die coating method, a roll coating method, a blade coating method, a bar coating method, a gravure coating method, or a printing method can be used. In order to form the material layer 109 by such a wet method, a predetermined evaporation material may be dissolved or dispersed in a solvent, and a solution or a dispersion may be adjusted. There is no particular limitation on the solvent as long as the evaporation material can be dissolved or dispersed therein and the solvent does not react with the evaporation material. Examples of the solvent are halogen-based solvents such as chloroform, tetrachloromethane, dichloromethane, 1,2-dichloroethane, and chlorobenzene; ketone-based solvents such as acetone, methyl ethyl ketone, diethyl ketone, n-propyl methyl ketone, and cyclohexanone; aromatic-based solvents such as benzene, toluene, and xylene; ester-based solvents such as ethyl acetate, n-propyl acetate, n-butyl acetate, ethyl propionate, γ-butyrolactone, and diethyl carbonate; ether solvents such as tetrahydrofuran and dioxane; amide-based solvents such as dimethylformamide and dimethylacetamide; dimethyl sulfoxide; hexane; water; and the like. A mixture of plural kinds of these solvents may be used. By using a wet method, material use efficiency can be improved and manufacturing cost of a light-emitting device can be reduced.

Note that the thickness and uniformity of an EL layer which is formed over the deposition target substrate 201 in a later step depends on the material layer 109 formed over the second supporting substrate 105. Therefore, it is important to form the material layer 109 uniformly. Note that the material layer 109 is not necessarily a uniform layer as long as the thickness and uniformity of the EL layer are ensured. For example, the material layer 109 may be formed into minute island shapes or may be formed into an uneven layer. In addition, by controlling the thickness of the material layer 109, the thickness of an EL layer 207 which is formed over the deposition target substrate 201 can be controlled easily.

Note that any of a variety of materials can be used as the evaporation material regardless of whether they are organic compounds, inorganic compounds, or organic compounds containing inorganic compounds. Since many organic compounds have a lower evaporation temperature than inorganic compounds, organic compounds are easily evaporated by light irradiation and particularly suitable for the method for manufacturing a light-emitting device of the present invention. Examples of organic compounds are light-emitting materials, carrier transporting materials, and the like which are used for a light-emitting device. Examples of inorganic compounds are metal oxides, metal nitrides, metal halides, elementary substances of metal, and the like which are used for a carrier-transporting layer, a carrier-injecting layer, an electrode, and the like of a light-emitting device.

Note that in FIG. 1A, the first supporting substrate 101 and the second supporting substrate 105 are aligned so that the opening of the reflective layer 103 and the first region of the light absorption layer 107 overlap with each other. At least one of the first supporting substrate 101 and the second supporting substrate 105 is preferably provided with an alignment marker. Note that in the first supporting substrate 101, a part of the reflective layer 103 over and near the alignment marker is preferably removed in advance and in the second supporting substrate 105, a part of the light absorption layer and a part of the material layer over and near the alignment marker are preferably removed in advance.

Figure 1B:
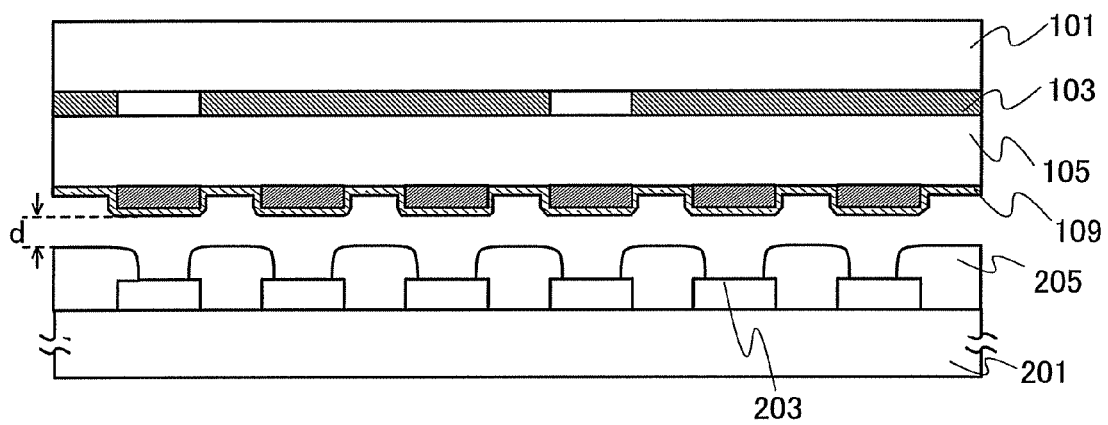

Then, as illustrated in FIG. 1B, the deposition target substrate 201 is disposed in position to face a surface of the evaporation donor substrate 110 where the light absorption layer 107 and the material layer 109 are formed. The deposition target substrate 201 is a substrate onto which a desired EL layer is deposited through evaporation treatment. Then, the evaporation donor substrate 110 and the deposition target substrate 201 are disposed close to each other, specifically, they are disposed close to each other so that the distance d between the surface of the material layer 109 provided in the evaporation donor substrate 110 and the deposition target substrate 201 is 0 mm or more and 2 mm or less, preferably 0 mm or more and 0.05 mm or less, more preferably 0 mm or more and 0.03 mm or less.

Note that the distance d is defined as the distance between the surface of the material layer 109 formed over the second supporting substrate 105 and the surface of the deposition target substrate 201. When some layer (such as a conductive layer that serves as an electrode or an insulating layer that serves as a partition wall) is formed over the deposition target substrate 201, the distance d is defined as the distance between the surface of the material layer 109 and the surface of the layer formed over the deposition target substrate. Note that when the surface of the material layer 109 or the surface of the layer formed over the deposition target substrate 201 is uneven, the distance d is defined as the shortest distance between the outermost surface of the material layer 109 and the outermost surface of the layer formed over the deposition target substrate or the outermost surface of the deposition target substrate.

By reducing the distance d, material use efficiency can be improved. In addition, the accuracy of patterning of the layer which is formed over the deposition target substrate can be improved. Note that in order to improve material use efficiency and also to improve the accuracy of patterning, the distance between the evaporation donor substrate 110 and the deposition target substrate 201 is preferably short, but the present invention is not limited thereto.

Figure 1C:
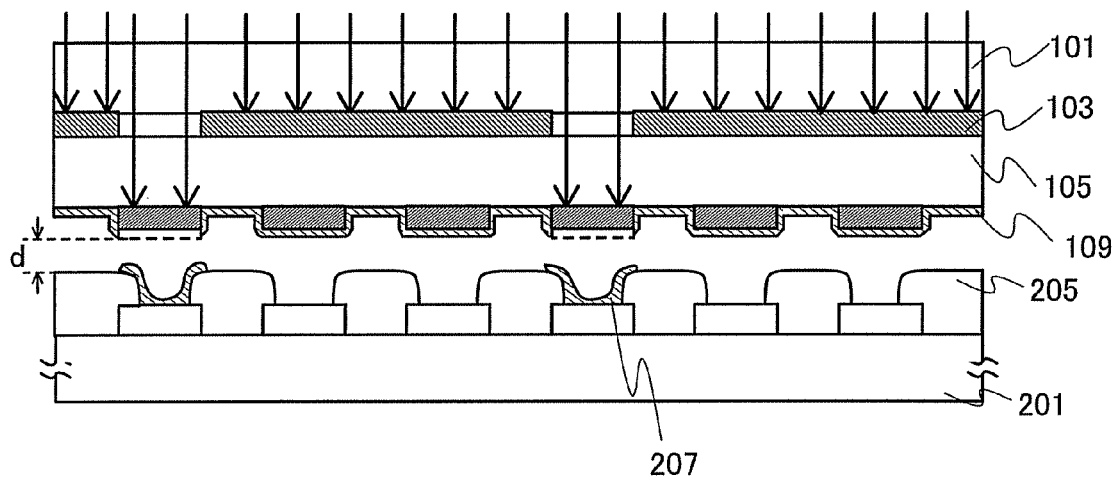

In FIGS. 1B and 1C, the deposition target substrate 201 is provided with a first electrode layer 203. Edge portions of the first electrode layer 203 are preferably covered with an insulator 205. By providing the insulator 205, in the case where the distance d is 0 mm, that is, where the outermost surface of the evaporation donor substrate 110 and the outermost surface of the deposition target substrate 201 are in contact with each other, parts of the material layer 109 on second and third regions of the light absorption layer 107 and region where pixels are to be formed can be prevented from being in contact with each other. In this embodiment mode, the first electrode layer 203 represents an electrode which serves as an anode or a cathode of a light-emitting element.

Note that in FIG. 1B, the evaporation donor substrate 110 and the deposition target substrate 201 are aligned so that the opening of the reflective layer 103 and the first electrode layer 203 overlap with each other. Accordingly, the deposition target substrate is preferably provided with an alignment marker. In addition, the second supporting substrate 105 is also preferably provided with an alignment marker. Note that in the second supporting substrate 105, a part of the light absorption layer 107 and a part of the material layer 109 over and near the alignment marker are preferably removed in advance. In addition, the alignment marker which is used for aligning the first supporting substrate 101 and the second supporting substrate 105 can also be used as the alignment marker for aligning the evaporation donor substrate 110 and the deposition target substrate 201.

Then, as illustrated in FIG. 1C, a first supporting substrate 101 side of the evaporation donor substrate 110 is irradiated with light. The irradiation light is reflected in a region where the reflective layer 103 is formed but is transmitted through the opening of the reflective layer 103 to be absorbed in the first region of the light absorption layer 107 which overlaps with the opening. The absorbed light is converted into heat energy, whereby a part of the material layer 109 which is in contact with the light absorption layer 107 in the region overlapping with the opening is heated so that the evaporation material is evaporated onto the first electrode layer. Thus, the EL layer 207 is deposited (a first transferring step).

Note that even when the reflective layer 103 is formed using a material having a reflectance of 85% or more, in irradiation of the evaporation donor substrate 110 with light, a certain amount of heat may be absorbed depending on the energy power of the irradiation light. However, in the evaporation donor substrate according to the present invention, the second supporting substrate 105 formed of a material with low thermal conductivity is preferably provided in contact with the reflective layer 103; therefore, even when the reflective layer 103 is heated, conduction of heat to the light absorption layer 107 can be blocked by the second supporting substrate 105. In addition, since the light absorption layer 107 is patterned into island or stripe shapes, conduction of heat generated in the light absorption layer 107 in a surface direction can be prevented compared with the case where the light absorption layer is formed over the entire surface of the second supporting substrate 105. Thus, a part of the material layer 109 in the region overlapping with the opening of the reflective layer 103 is selectively heated and the EL layer 207 having a desired pattern can be formed over the deposition target substrate with high accuracy.

In this embodiment mode, the first supporting substrate 101, the second supporting substrate 105, and the deposition target substrate 201 may be formed of materials having the same properties. By using the first supporting substrate 101, the second supporting substrate 105, and the deposition target substrate 201 which are formed of materials having the same properties, the coefficient of thermal expansion of the three substrates can be the same. Therefore, in irradiation of the evaporation donor substrate with light, if the evaporation donor substrate is expanded by heat, the deposition target substrate is also expanded at the same coefficient of thermal expansion. Accordingly, reduction in transferring accuracy due to difference in expansion coefficient can be suppressed. Note that the first supporting substrate 101, the second supporting substrate 105, and the deposition target substrate 201 are not always necessarily formed of materials having the same properties. If difference between the coefficients of thermal expansion is small enough so as not to affect the transferring accuracy, materials having different properties may be used.

The evaporation donor substrate according to the present invention includes, instead of a conventional light-blocking mask, the first supporting substrate 101 provided with the reflective layer 103 having an opening. In the first supporting substrate 101, since the opening of the reflective layer 103 is formed by a photolithography method, the opening can has near vertical side walls and the top surface of the reflective layer can be flat; therefore, adhesion between the first supporting substrate 101 and the second supporting substrate 105 is improved. By closely attaching the first supporting substrate 101 and the second supporting substrate 105, light is prevented from passing through a gap between the reflective layer 103 and the second supporting substrate 105; therefore, a desired part of the light absorption layer can be irradiated with high accuracy. Further, when the first supporting substrate 101 is a glass substrate, a quartz substrate, a plastic substrate containing an inorganic glass, or the like, the first supporting substrate 101 can be easily treated compared with a conventional light-blocking mask, which is preferable.

Any of a variety of light sources can be used as a light source of the irradiation light.

For example, as a light source of laser light, a gas laser such as an Ar laser, a Kr laser, or an excimer laser; a laser using, as a medium, single crystal YAG, YvO$_4$, forsterite (Mg$_2$SiO$_4$), YAlO$_3$, or GdVO$_4$, or polycrystalline (ceramic) YAG, Y$_2$O$_3$, YVO$_4$, YAlO$_3$, or GdVO$_4$ doped with one or more of Nd, Yb, Cr, Ti, Ho, Er, Tm, and Ta as a dopant; a glass laser; a ruby laser; an alexandrite laser; a Ti:sapphire laser; a copper vapor laser; a gold vapor laser; or a combination thereof can be used. In addition, a solid-state laser that uses a solid as a laser medium is advantageous in that a maintenance-free condition can be maintained for a long time and output power is relatively stable.

As a light source other than a laser, a discharge lamp such as a xenon lamp or a metal halide lamp, or an exothermic lamp such as a halogen lamp or a tungsten lamp can be used as the light source. Alternatively, such a light source can be used as a flash lamp (e.g., a xenon flash lamp or a krypton flash lamp). Since a flash lamp is capable of emitting very high-intensity light to a large area for a short time (0.1 msec to 10 msec) repeatedly, it can uniformly and efficiently heat the evaporation donor substrate regardless of the area of the evaporation donor substrate. Further, heating of the evaporation donor substrate can be controlled by a change in length of a light-emitting period. In addition, a flash lamp has a long life and consumes less power on standby for light emission and therefore can reduce the running cost.

Note that the irradiation light is preferably infrared light (at a wavelength of 800 nm or more). With infrared light, the light absorption layer 107 can be efficiently heated and the evaporation material can be efficiently heated.

Here, since the openings of the reflective layer 103 are provided in a manner such that one opening is provided for every three patterns of the light absorption layer 107, the material layer 109 is transferred in accordance with the repeating patterns of the openings of the reflective layer 103. The material layer 109 remains on the light absorption layer 107 between the openings. The evaporation donor substrate according to the present invention includes the two supporting substrates: the first supporting substrate 101 on which the reflective layer 103 is formed and the second supporting substrate 105 on which the light absorption layer 107 and the material layer 109 are formed. Therefore, by changing the positional relationship between the two supporting substrates, the material layer 109 which is left in the first transferring step can be utilized in the next transferring step.

Figure 2A:
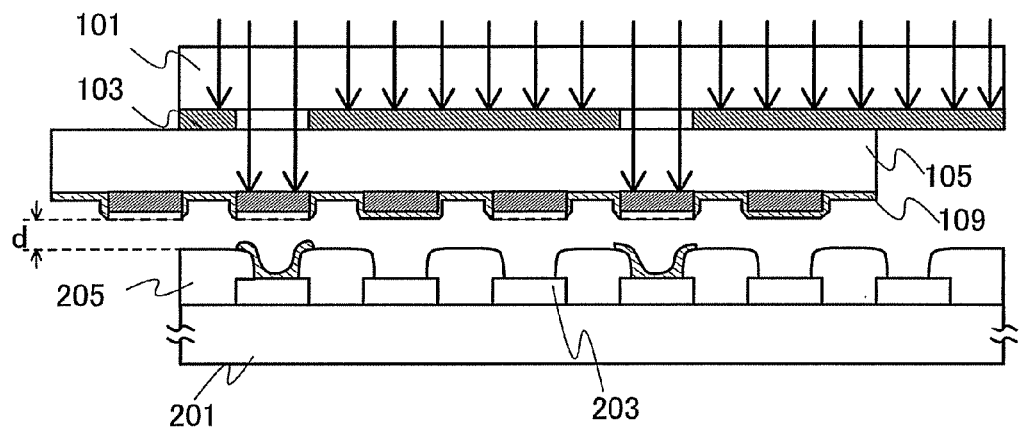
FIGS. 2A and 2B are schematic views illustrating cross sections in a deposition step according to an aspect of the present invention.

FIG. 2A illustrates a second transferring step which uses the evaporation donor substrate 110 used in the above-described first transferring step. In the second transferring step in FIG. 2A, the first supporting substrate 101 and the second supporting substrate 105 are aligned so that the opening of the reflective layer 103 and the second region of the light absorption layer 107 overlap with each other. At least one of the first supporting substrate 101 and the second supporting substrate 105 is preferably provided with an alignment marker for the second transferring step. Note that the second region of the light absorption layer 107 is a region next to the first region of the light absorption layer 107 which is irradiated with light in the previous transferring step. The first supporting substrate 101 and the second supporting substrate 105 may be disposed in a manner such that either or both of the first supporting substrate 101 and the second supporting substrate 105 are shifted by the distance between the patterns of the light absorption layer.

The deposition target substrate 201 and the evaporation donor substrate 110 in which the first supporting substrate 101 and the second supporting substrate 105 are aligned are disposed to face each other and aligned. At least one of the evaporation donor substrate 110 and the deposition target substrate 201 is preferably provided with an alignment marker for the second transferring step. The evaporation donor substrate 110 and the deposition target substrate 201 are disposed so that they are relatively shifted by the width of the evaporation donor substrate 110 from the first transferring step. Note that in the case of manufacturing a deposition target substrate corresponding to single color display using the evaporation donor substrate 110 of the present invention, the evaporation donor substrate 110 and the deposition target substrate 201 are preferably disposed so that the opening in the evaporation donor substrate 110 and the deposition target substrate 201 are relatively shifted by one pixel from the first transferring step. In alignment of the two substrates, either or both of the evaporation donor substrate 110 and the deposition target substrate 201 may be moved. Alternatively, the evaporation donor substrate 110 may be disposed to face another deposition target substrate instead moving the deposition target substrate 201.

After the alignment, the first supporting substrate 101 side of the evaporation donor substrate 110 is irradiated with light.

The irradiation light is reflected in a region where the reflective layer 103 is formed but is transmitted through the opening of the reflective layer 103 to be absorbed in the second region of the light absorption layer 107 which overlaps with the opening. The absorbed light is converted into heat energy, whereby a part of the material layer 109 which is in contact with the light absorption layer 107 in the region overlapping with the opening is heated so that the evaporation material is evaporated onto the first electrode layer. Thus, the EL layer 207 is deposited (a second transferring step).

Figure 2B:
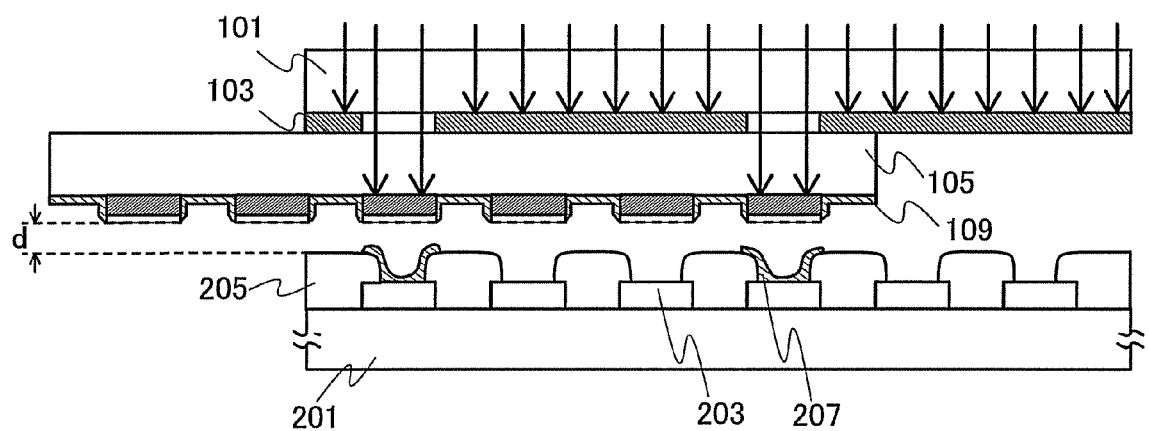

FIG. 2B illustrates a third transferring step which uses the evaporation donor substrate 110 used in the above-described first and second transferring steps. In the third transferring step in FIG. 2B, the first supporting substrate 101 and the second supporting substrate 105 are aligned so that the opening of the reflective layer 103 and the third region of the light absorption layer 107 overlap with each other. At least one of the first supporting substrate 101 and the second supporting substrate 105 is preferably provided with an alignment marker for the third transferring step. Note that the third region of the light absorption layer 107 is a region next to the second region of the light absorption layer 107 which is irradiated with light in the second transferring step. The first supporting substrate 101 and the second supporting substrate 105 may be disposed in a manner such that either or both of the first supporting substrate 101 and the second supporting substrate 105 are shifted by the distance between the patterns of the light absorption layer.

The deposition target substrate 201 and the evaporation donor substrate 110 in which the first supporting substrate 101 and the second supporting substrate 105 are aligned are disposed to face each other and aligned. At least one of the evaporation donor substrate 110 and the deposition target substrate 201 is preferably provided with an alignment marker for the third transferring step. The evaporation donor substrate 110 and the deposition target substrate 201 are disposed so that they are relatively shifted by the width of the evaporation donor substrate 110 from the second transferring step. Note that in the case of manufacturing a deposition target substrate corresponding to single color display using the evaporation donor substrate 110 of the present invention, the evaporation donor substrate 110 and the deposition target substrate 201 are preferably disposed so that the opening in the evaporation donor substrate 110 and the deposition target substrate 201 are relatively shifted by one pixel from the second transferring step. In alignment of the two substrates, either or both of the evaporation donor substrate 110 and the deposition target substrate 201 may be moved. Alternatively, the evaporation donor substrate 110 may be disposed to face another deposition target substrate instead moving the deposition target substrate 201 to face the evaporation donor substrate 110.

After the alignment, the first supporting substrate 101 side of the evaporation donor substrate 110 is irradiated with light. The irradiation light is reflected in a region where the reflective layer 103 is formed but is transmitted through the opening of the reflective layer 103 to be absorbed in the third region of the light absorption layer 107 which overlaps with the opening. The absorbed light is converted into heat energy, whereby a part of the material layer 109 which is in contact with the light absorption layer 107 in the region overlapping with the opening is heated so that the evaporation material is evaporated onto the first electrode layer. Thus, the EL layer 207 is deposited (the third transferring step).

Through the above-described first to third transferring steps, parts of the material layer 109 which are located on the first to third regions of the light absorption layer, of the evaporation donor substrate 110, can be transferred to the deposition target substrate 201.

In a method for manufacturing a light-emitting device of the present invention, a light absorption layer is heated not with radiation heat but with light from a light source. In addition, the length of time for light irradiation may be relatively short so that the material layer 109 which is formed in the evaporation donor substrate 110 is not entirely evaporated. For example, when a halogen lamp is used as a light source, by keeping 500 to 800° C. for about 7 to 15 seconds, the material layer can be evaporated.

In addition, deposition is preferably performed in a reduced-pressure atmosphere. The reduced-pressure atmosphere can be obtained by evacuating the deposition chamber with a vacuum evacuation means to a vacuum of about $5 \times 10^{-3}$ Pa or less, preferably, about $10^{-4}$ to $10^{-6}$ Pa.

In the case where a light source of light having high directivity such as laser light is used, the light absorption layer 107 is irradiated with light having directivity through the opening of the reflective layer 103, and a part of the material layer 109 which is in contact with a part of the light absorption layer 107 which is irradiated with light is heated. That is, light which has passed through the opening of the reflective layer 103 is less likely to spread. Accordingly, a part of the material layer 109 which has the same or almost the same area as a region corresponding to the opening of the reflective layer 103 is evaporated; therefore, the width of the opening of the reflective layer 103 and the pattern of the light absorption layer 107 can be substantially the same as the width of the pixel. Because the irradiation light is less likely to spread, a structure may be employed in which the edge of the reflective layer 103 is aligned with the edge of the light absorption layer 107 when seen from a light irradiation side.

On the other hand, in the case where a light source of light having low directivity such as a flash lamp is used, a phenomenon occurs in which light which has passed through the opening of the reflective layer 103 spreads while being transmitted through the second supporting substrate 105 and delivered to the light absorption layer 107. Then, a part of the material layer 109 which has a larger area than a region corresponding to the opening of the reflective layer 103 is evaporated. Accordingly, in consideration of spreading of the irradiation light, it is preferable that the opening of the reflective layer 103 be smaller than the pixel. In addition, the width of the opening of the reflective layer 103 is preferably smaller than the width of the pattern of the light absorption layer 107.

Note that although the case where the deposition target substrate 201 is located below evaporation donor substrate 110 is described in this embodiment mode, the present invention is not limited to this case. The orientation of the substrates can be set as appropriate.

In a deposition method according to the present invention which is applied to a light-emitting device, by controlling the thickness of the material layer 109 formed over the second supporting substrate, the thickness of the EL layer 207 which is deposited onto the deposition target substrate 201 through evaporation treatment can be controlled. That is, the material layer 109 formed over the second supporting substrate 105 may be evaporated as it is; thus, a thickness monitor is not needed. Therefore, a user does not have to adjust the evaporation rate with a thickness monitor, and the whole deposition process can be automated. Accordingly, productivity can be increased.

By the deposition method according to the present invention which is applied to a light-emitting device, the evaporation material contained in the material layer 109 can be uniformly heated. In addition, in the case where the material layer 109 contains plural kinds of evaporation materials, the EL layer 207 containing the same evaporation materials at roughly the same weight ratio as those of the material layer 109 can be deposited onto the deposition target substrate 201. Thus, in the deposition method according to the present invention, in the case where deposition is performed using plural kinds of evaporation materials having different evaporation temperatures, unlike the case of co-evaporation, the evaporation rate of each evaporation material does not need to be controlled. Accordingly, without complicated control of the evaporation rate or the like, a layer containing different kinds of desired evaporation materials can be deposited easily with high accuracy.

According to the present invention, a flat and even film can be deposited. In addition, according to the present invention, patterning of a light-emitting layer can be facilitated; thus, manufacture of a light-emitting device can also be facilitated. Further, a minute pattern can be formed; thus, a high-definition light-emitting device can be obtained. Furthermore, according to the present invention, a lamp heater or the like which is inexpensive but provides a large amount of energy power can be used as an alternative to a laser as a light source. Moreover, by using a lamp heater or the like as a light source, deposition can be performed on a large area at a time; thus, cycle time can be reduced. Accordingly, manufacturing cost of a light-emitting device can be reduced.

Moreover, by the deposition method according to the present invention, a desired evaporation material can be deposited onto the deposition target substrate without being wasted. Thus, use efficiency of an evaporation material is increased, and cost reduction can be achieved. Moreover, an evaporation material can be prevented from being attached to an inner wall of a deposition chamber, and thus maintenance of a deposition apparatus can be facilitated.

Accordingly, application of the present invention makes it easy to deposit a layer containing different kinds of desired evaporation materials and makes it possible to increase productivity in manufacture of a light-emitting device or the like which uses the layer containing different kinds of evaporation materials.

In addition, by using the evaporation donor substrate according to the present invention, an evaporation material can be deposited with high use efficiency and thus cost reduction can be achieved. Further, by using the evaporation donor substrate according to the present invention, a film having a desired shape can be formed with high accuracy.

Note that this embodiment mode can be combined with any other embodiment mode described in this specification as appropriate.

(Embodiment Mode 2)

This embodiment mode describes a method for manufacturing a full-color display device by using the evaporation donor substrate described in the above embodiment mode.

Embodiment Mode 1 describes an example in which an EL layer of single color is formed in every three pixels using one evaporation donor substrate. However, in the case of manufacturing a full-color display device, light-emitting layers for emitting light of different colors are formed in different regions through a plurality of deposition steps.

A manufacturing example of a light-emitting device capable of full-color display is described below. Here, a light-emitting device using light-emitting layers for emitting light of three colors is given as an example.

Three evaporation donor substrates illustrated in FIG. 1A are prepared. In each of the evaporation donor substrates, a material layer containing a different kind of evaporation material is formed. Specifically, a first evaporation donor substrate provided with a material layer for a red light-emitting layer, a second evaporation donor substrate provided with a material layer for a green light-emitting layer, and a third evaporation donor substrate provided with a material layer for a blue light-emitting layer are prepared.

In addition, one deposition target substrate provided with first electrode layers is prepared. Note that an insulator serving as a partition wall covering an edge portion of each first electrode layer is preferably provided so that the adjacent first electrode layers are not short-circuited. A region which serves as a light-emitting region corresponds to a part of the first electrode layer, that is, a region of the first electrode layer which is exposed without overlapping with the insulator.

Then, after the deposition target substrate and the first evaporation donor substrate are disposed to overlap with each other and are aligned with each other, a first supporting substrate side of the first evaporation donor substrate is irradiated with light. A part of the light absorption layer which is located over the opening of a reflective layer absorbs the irradiation light to generate heat, whereby a part of the material layer for the red light-emitting layer which is in contact with the part of the light absorption layer is heated; thus, a first transferring step using the first evaporation donor substrate onto the first electrode layer provided over the deposition target substrate is performed. After the first transferring step, as described in the above embodiment mode, the first or the second supporting substrate included in the evaporation donor substrate is moved as appropriate, then, second and third transferring steps are performed. Thus, the material layer for the red light-emitting layer is deposited. By shifting the first supporting substrate and/or the second supporting substrate to be used for a plurality of transferring steps, the material layer for the red light-emitting layer can be used efficiently. After the deposition, the first evaporation donor substrate is moved away from the deposition target substrate.

In the evaporation donor substrate according to the present invention, since the light absorption layer is patterned, heat converted in the light absorption layer is prevented from being conducted in the plane direction of the light absorption layer, and thus the part of the material layer which is located over the reflective layer can be prevented from being heated. Further, even when the reflective layer is heated, the second supporting substrate can prevent heat generated by heating of the reflective layer from being conducted to the light absorption layer. Thus, the EL layer can be formed over the deposition target substrate with high accuracy.

Then, the deposition target substrate and the second evaporation donor substrate are disposed to overlap with each other and are aligned with each other. In the second evaporation donor substrate, an opening of a reflective layer is disposed in a position which overlaps with a region which is shifted by one pixel from the EL layer evaporated using the first evaporation donor substrate.

Then, a back surface of the second evaporation donor substrate is irradiated with light. A part of a light absorption layer which is located over an opening of a reflective layer absorbs the irradiation light to generate heat, whereby a part of the material layer for the green light-emitting layer which is in contact with the part of the light absorption layer is heated; thus, a first transferring step using the second evaporation donor substrate onto the first electrode layer provided over the deposition target substrate is performed. After the first transferring step, as described in the above embodiment mode, the first or the second supporting substrate included in the evaporation donor substrate is moved as appropriate, then, second and third transferring steps are performed. Thus, the material layer for the green light-emitting layer is deposited. By shifting the first supporting substrate and/or the second supporting substrate to be used for a plurality of transferring steps, the material layer for the green light-emitting layer can be used efficiently. After the deposition, the second evaporation donor substrate is moved away from the deposition target substrate.

Then, the deposition target substrate and the third evaporation donor substrate are disposed to overlap with each other and are aligned with each other. In the third evaporation donor substrate, an opening of a reflective layer is disposed in a position which overlaps with a region which is shifted by two pixels from the EL layer evaporated using the first evaporation donor substrate.

Figure 3A:
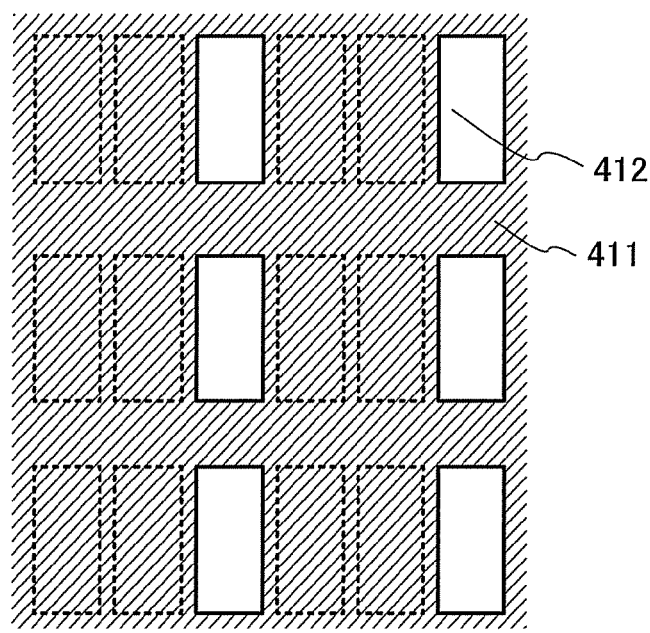
FIGS. 3A and 3B illustrate a deposition step according to an aspect of the present invention.

Then, a back surface of the third evaporation donor substrate is irradiated with light to perform third deposition. A state right before the third deposition corresponds to the top view of FIG. 3A. A reflective layer 411 has an opening 412. A light absorption layer is formed in a region corresponding to the opening 412. A region of the deposition target substrate which corresponds to the opening 412 is a region where the first electrode layer is exposed without by being covered with the insulator 413. In addition, regions of the deposition target substrate which correspond to regions indicated by dotted lines in FIG. 3A are provided with first films (R) 421 formed through first deposition and second films (G) 422 formed through second deposition.

Figure 3B:
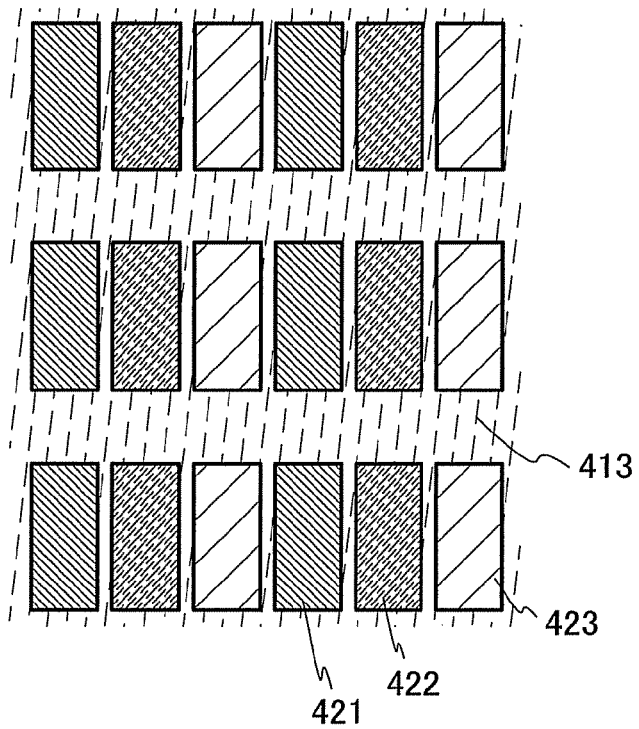

Then, a third film (B) 423 is formed through the third deposition (FIG. 3B). The irradiation light passes through the opening of the reflective layer and is absorbed in the part of the light absorption layer which is formed in the region corresponding to the opening, whereby the part of the light absorption layer generates heat. Then, the part of the material layer for the blue light-emitting layer which is in contact with the part of the light absorption layer which is formed in the region corresponding to the opening is heated; thus, a first transferring step using the third evaporation donor substrate onto the first electrode layer provided over the deposition target substrate is performed. After the first transferring step, as described in the above embodiment mode, the first or the second supporting substrate included in the evaporation donor substrate is moved as appropriate, then, second and third transferring steps are performed. Thus, the material layer for the blue light-emitting layer is deposited. By shifting the first supporting substrate and/or the second supporting substrate to be used for a plurality of transferring steps, the material layer for the blue light-emitting layer can be used efficiently. After the deposition, the third evaporation donor substrate is moved away from the deposition target substrate.

In this manner, the first film (R) 421, the second film (G) 422, and the third film (B) 423 are formed as selected at regular intervals. Then, a second electrode layer is formed over these films. Thus, light-emitting elements are formed.

Through the above-described process, a full-color display device can be manufactured.

Although FIGS. 3A and 3B illustrate an example in which the opening 412 of the reflective layer formed in the evaporation donor substrate has a rectangular shape, the present invention is not particularly limited to this shape and a stripe opening may be employed. In the case where the stripe opening is employed, although deposition is also performed between light-emitting regions for emitting light of the same color, the deposition between light-emitting regions is performed on the insulator 413, so that a part which overlaps with the insulator 413 does not serve as a light-emitting region.

Figure 4A:
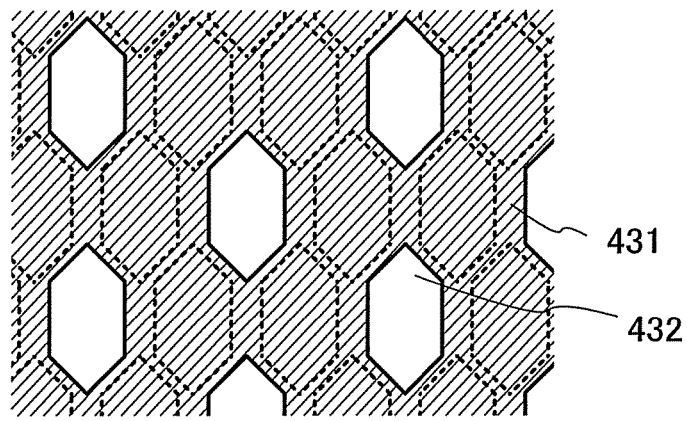
FIGS. 4A and 4B illustrate a deposition step according to an aspect of the present invention.
Figure 4B:
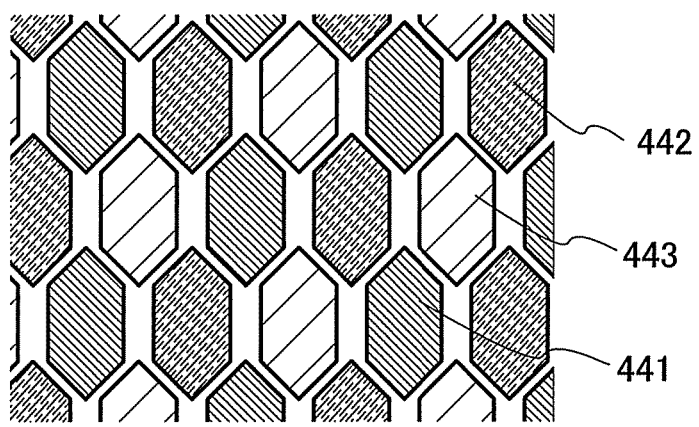

In addition, there is no particular limitation on the arrangement of the pixels. The shape of each pixel may be a polygon, for example, a hexagon as illustrated in FIG. 4B, and a full-color display device may be realized by arrangement of first films (R) 441, second films (G) 442, and third films (B) 443. In order to form polygonal pixels illustrated in FIG. 4B, deposition may be performed using a first supporting substrate including a reflective layer 431 having a polygonal opening 432 illustrated in FIG. 4A and a second supporting substrate as an evaporation donor substrate.

According to the present invention, an EL layer included in a light-emitting element can be easily formed, and also a light-emitting device including the light-emitting element can be easily manufactured. In addition, according to the present invention, patterning of a light-emitting layer can be facilitated; thus, manufacture of a light-emitting device can also be facilitated. Further, a minute pattern can be formed; thus, a high-definition light-emitting device can be obtained. Furthermore, according to the present invention, a lamp heater or the like which is inexpensive but provides a large amount of energy power can be used as an alternative to a laser as a light source. Accordingly, manufacturing cost of a light-emitting device can be reduced.

In addition, in formation of a light-emitting layer in which a dopant material is dispersed in a host material, less complicated control is needed according to the present invention, compared to the case where co-evaporation is applied. Further, since the additive amount or the like of the dopant material is easy to control, deposition can be performed easily and accurately; therefore, a desired emission color can be obtained easily. In addition, use efficiency of an evaporation material can be increased; thus, cost reduction can also be achieved.

Note that this embodiment mode can be combined with any other embodiment mode described in this specification as appropriate.

(Embodiment Mode 3)

In this embodiment mode, examples of deposition apparatuses which enable manufacture of the light-emitting device of the present invention are described. FIGS. 5A and 5B and FIGS. 6A and 6B are schematic cross-sectional views of deposition apparatuses of this embodiment mode.

Figure 5A:
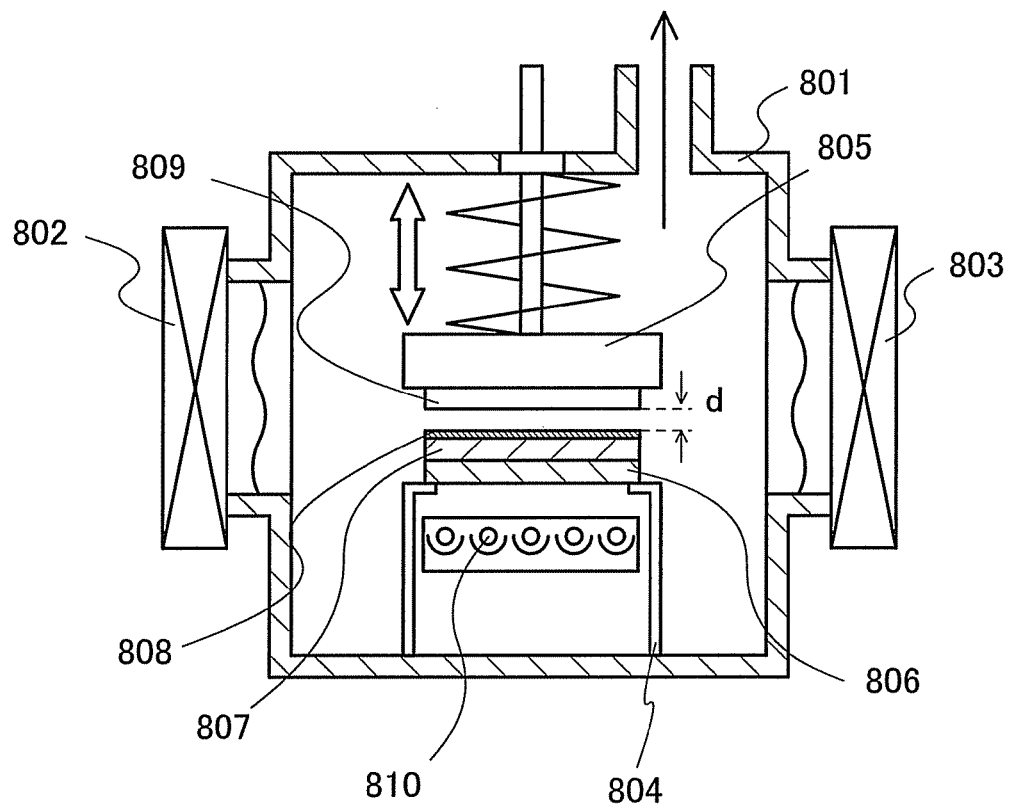
FIGS. 5A and 5B each illustrate an example of a deposition apparatus.

In FIG. 5A, a deposition chamber 801 is a vacuum chamber and is connected to other treatment chambers via a first gate valve 802 and a second gate valve 803. In addition, the deposition chamber 801 includes at least an evaporation donor substrate supporting mechanism which is an evaporation donor substrata supporting means 804, a deposition target substrate supporting mechanism which is a deposition target substrate supporting means 805, and a light source 810.

First, in another deposition chamber, with the structure described in the above embodiment mode, a material layer 808 is formed over the second supporting substrate provided with a light absorption layer. In this embodiment mode, the evaporation donor substrate includes a first supporting substrate 806 and a second supporting substrate 807. In addition, the second supporting substrate 807 corresponds to the second supporting substrate 105 illustrated in FIGS. 1A to 1C, the material layer 808 corresponds to the material layer 109, and the first supporting substrate 806 corresponds to the first supporting substrate 101 illustrated in FIGS. 1A to 1C. Note that although not illustrated, a reflective layer having an opening is provided between the first supporting substrate 806 and the second supporting substrate 807, and a light absorption layer is provided between the second supporting substrate 807 and the material layer 808. In this embodiment mode, as the first or second supporting substrate, a square plate substrate containing copper as its main component is used. In addition, for the material layer 808, a material that can be evaporated is used.

Note that there is no particular limitation on the shape of the first supporting substrate 806 and the second supporting substrate 807. In addition, the material layer 808 can be formed by a dry method or a wet method, and in particular, a wet method is preferable. For example, a spin coating method, a printing method, an inkjet method, or the like can be used.

Next, the first supporting substrate 806 and the second supporting substrate 807 are transported to the deposition chamber 801 and are set on the evaporation donor substrate supporting mechanism. Here, the first supporting substrate 806 and the second supporting substrate 807 are aligned with a maker. In addition, the deposition target substrate 809 is fixed to the deposition target substrate supporting mechanism so that a surface of the second supporting substrate 807 on which the material layer 808 is formed faces a deposition target surface of the deposition target substrate 809.

Figure 5B:
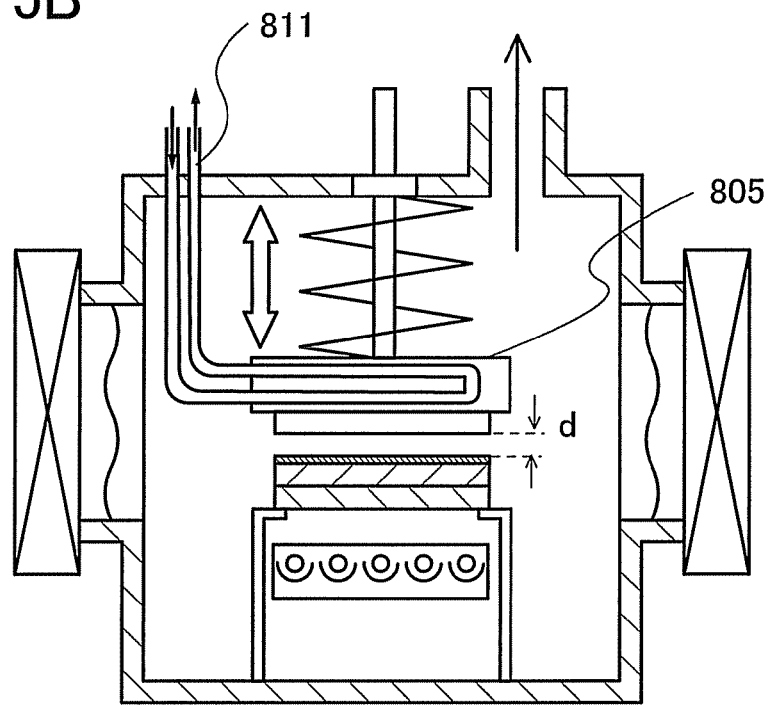

The deposition target substrate supporting means 805 is moved so that the second supporting substrate 807 and the deposition target substrate 809 has the distance d therebetween. Note that the distance d is defined as the distance between a surface of the material layer 808 formed over the second supporting substrate 807 and a surface of the deposition target substrate 809. In addition, when some layer (e.g., a conductive layer which serves as an electrode or an insulating layer which serves as a partition wall) is formed over the deposition target substrate 809, the distance d is defined as the distance between the surface of the material layer 808 over the second supporting substrate 807 and the surface of the layer formed over the deposition target substrate 809. Note that when the surface of the deposition target substrate 809 or the surface of the layer formed over the deposition target substrate 809 is uneven, the distance d is defined as the shortest distance between the surface of the material layer 808 over the second supporting substrate 807 and the outermost surface of the deposition target substrate 809 or the outermost surface of the layer formed over the deposition target substrate 809. If the deposition target substrate 809 is hard like a quartz substrate and formed of a material which is unlikely to be deformed (flexure, warpage, or the like), the distance d can be reduced to 0 mm as the minimum distance. Note that the distance d of 0 mm refers to a state in which the outermost surface of the deposition target substrate and the outermost surface of the evaporation donor substrate of the present invention are in contact with each other. In addition, although FIGS. 5A and 5B illustrate examples in which the evaporation donor substrate supporting mechanism is fixed while deposition target substrate supporting mechanism is moved for controlling the distance between the substrates, a structure may also be employed in which the evaporation donor substrate supporting substrate is moved while the deposition target substrate supporting mechanism is fixed. Alternatively, both the evaporation donor substrate supporting mechanism and the deposition target substrate supporting mechanism may be moved. Note that FIG. 5A illustrates a cross section of a step in which the deposition target substrate supporting means 805 is moved so that the evaporation donor substrate and the deposition target substrate are disposed close to each other to have the distance d therebetween.

Alternatively, a structure may also be employed in which the evaporation donor substrate supporting mechanism and the deposition target substrate supporting mechanism are moved not only in a vertical direction but also in a horizontal direction and precise alignment is performed. In addition, the deposition chamber 801 may include an alignment mechanism such as CCD for precise alignment or measurement of the distance d. In addition, a sensor for measuring the temperature or humidity inside the deposition chamber 801, or the like may be provided.

The evaporation donor substrate is irradiated with light from the light source 810. Thus, the material layer 808 over the second supporting substrate is heated in a short time, whereby an evaporation material is deposited onto the deposition target surface (i.e., a lower surface) of the deposition target substrate 809, which is disposed to face the material layer 808. In the deposition apparatus illustrated in FIG. 5A, since the material layer 808, which is an evaporation source, may be evaporated as it is, deposition with high uniformity in thickness can be performed onto the deposition target substrate without using a thickness monitor. In addition, although a substrate is rotated in a conventional evaporation apparatus, the deposition target substrate is fixed during deposition in the deposition apparatus illustrated in FIG. 5A; therefore, this deposition apparatus is suitable for deposition onto a large-area glass substrate that is easily broken. In addition, in the deposition apparatus in FIG. 5A, the evaporation donor substrate is also fixed during deposition.

Note that a large part of the light source 810 is preferably opposite the evaporation donor substrate so that uniform heating can be performed.

In order to reduce effects of heat on the material layer 808 of the evaporation donor substrate by the light source on standby, an openable and closable shutter used for heat insulation on standby (before an evaporation process) may be provided between the light source 810 and the evaporation donor substrate.

The light source 810 may be a heating means capable of uniform heating in a short time. For example, a laser device or a lamp may be used.

For example, as a light source of laser light, a gas laser such as an Ar laser, a Kr laser, or an excimer laser; a laser using, as a medium, single crystal YAG, YVO$_4$, forsterite (Mg$_2$SiO$_4$), YAlO$_3$, or GdVO$_4$, or polycrystalline (ceramic) YAG, Y$_2$O$_3$, YVO$_4$, YAlO$_3$, or GdVO$_4$ doped with one or more of Nd, Yb, Cr, Ti, Ho, Er, Tm, and Ta as a dopant; a glass laser; a ruby laser; an alexandrite laser; a Ti:sapphire laser; a copper vapor laser; a gold vapor laser; or a combination thereof can be used. In addition, a solid-state laser that uses a solid as a laser medium is advantageous in that a maintenance-free condition can be maintained for a long time and output power is relatively stable.

As a lamp, for example, a discharge lamp such as a xenon lamp or a metal halide lamp, or an exothermic lamp such as a halogen lamp or a tungsten lamp can be used. Alternatively, such a light source can be used as a flash lamp (e.g., a xenon flash lamp or a krypton flash lamp). Since a flash lamp is capable of emitting very high-intensity light to a large area for a short time (0.1 msec to 10 msec) repeatedly, it can uniformly and efficiently heat the evaporation donor substrate regardless of the area of the evaporation donor substrate. Further, heating of the evaporation donor substrate can be controlled by a change in length of a light-emitting period. In addition, a flash lamp has a long life and consumes less power on standby for light emission and therefore can reduce the running cost. In addition, because a flash lamp facilitates rapid heating, a vertical movement mechanism, a shutter, and the like can be simplified compared with the case of using a heater. Thus, further reduction in size of the deposition apparatus can be achieved.

Although FIG. 5A illustrates an example in which the light source 810 is placed in the deposition chamber 801, a part of an inner wall of the deposition chamber may be made of a light-transmitting member and the light source 810 may be placed outside the deposition chamber. When the light source 810 is placed outside the deposition chamber 801, maintenance such as replacement of light bulbs of the light source 810 can be facilitated.

FIG. 5B illustrates an example of a deposition apparatus provided with a mechanism for adjusting the temperature of the deposition target substrate 809. Components in FIG. 5B which are the same as components in FIG. 5A are denoted by the same reference numerals. In FIG. 5B, the deposition target substrate supporting means 805 is provided with a tube 811 through which a heat medium flows. A refrigerant flows through the tube 811 as a heat medium, whereby the deposition target substrate supporting means 805 can be used as a cold plate. Note that the tube 811 has a mechanism with which it can follow the vertical movement of the deposition target substrate supporting means 805. As the heat medium, for example, water, silicone oil, or the like can be used. Note that although an example in which the tube through which a refrigerant gas or a liquid refrigerant flows is used is described here, the deposition target substrate supporting means 805 may be provided with a Peltier element or the like as a cooling means. Alternatively, not a cooling means but a heating means may be provided. For example, a heat medium for heating may be made to flow through the tube 811.

The deposition apparatus illustrated in FIG. 5B is useful in the case where different kinds of material layers are stacked. For example, in the case where a first EL layer has been formed on the deposition target substrate, a second EL layer which is formed of an evaporation material having a higher evaporation temperature than the first EL layer can be stacked on the first EL layer. In FIG. 5A, because the deposition target substrate and the evaporation donor substrate are disposed close to each other, the first EL layer which has been formed on the deposition target substrate may be sublimated. By using the deposition apparatus illustrated in FIG. 5B, the second EL layer can be stacked on the first EL layer which has been formed on the deposition target substrate while sublimation of the first EL layer is suppressed with a cooling mechanism.

The deposition target substrate supporting means 805 may be provided with a heating means such as a heater as well as the cooling mechanism. By providing a mechanism for controlling (heating or cooling), the temperature of the deposition target substrate can prevent flexure or the like of the substrate.

Figure 6A:
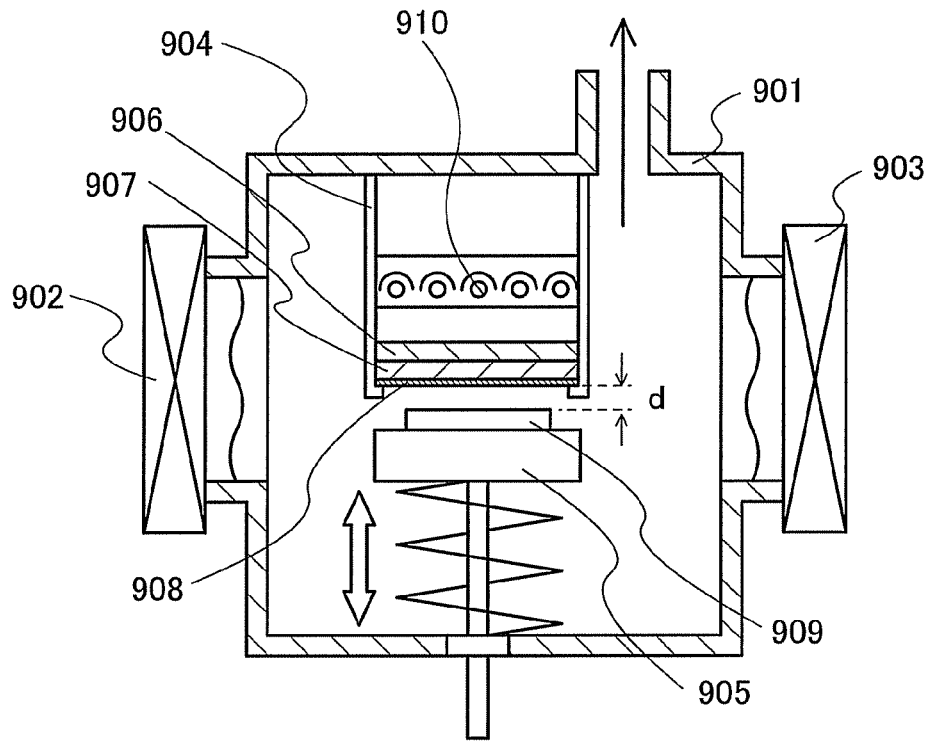
FIGS. 6A and 6B each illustrate an example of a deposition apparatus.

Note that although FIGS. 5A and 5B illustrate the example of the deposition apparatus employing a face-down system in which the deposition target surface of the deposition target substrate faces downward, a deposition apparatus employing a face-up system as illustrated in FIG. 6A may be used.

In FIG. 6A, a deposition chamber 901 is a vacuum chamber and is connected to other treatment chambers via a first gate valve 902 and a second gate valve 903. The deposition chamber 901 includes at least a deposition target substrate supporting mechanism which is a deposition target substrate supporting means 905, an evaporation donor substrate supporting mechanism which is an evaporation donor substrata supporting means 904, and a light source 910.

A deposition step is as follows. First, in another deposition chamber, with the structure described in the above embodiment mode, a material layer 908 is formed over a second supporting substrate 907 provided with a light absorption layer. In this embodiment mode, the evaporation donor substrate includes a first supporting substrate 906 and a second supporting substrate 907. In addition, the second supporting substrate 907 corresponds to the second supporting substrate 105 illustrated in FIGS. 1A to 1C, the material layer 908 corresponds to the material layer 109, and the first supporting substrate 906 corresponds to the first supporting substrate 101 illustrated in FIGS. 1A to 1C. Note that although not illustrated, a reflective layer having an opening is provided between the first supporting substrate 906 and the second supporting substrate 907, and a light absorption layer is provided between the second supporting substrate 907 and the material layer 908. The material layer 908 contains plural kinds of materials which can be evaporated and have different evaporation temperatures. The material layer 908 can be formed by a dry method or a wet method, and in particular, a wet method is preferable. For example, a spin coating method, a printing method, an inkjet method, or the like can be used.

Next, the first supporting substrate 906 and the second supporting substrate 907 are transported to the deposition chamber 901 and are set on the evaporation donor substrate supporting mechanism. Here, the first supporting substrate 906 and the second supporting substrate 907 are aligned with a maker. In addition, the deposition target substrate is fixed to the evaporation donor substrate supporting mechanism so that a surface of the second supporting substrate 907 on which the material layer 908 is formed faces a deposition target surface of the deposition target substrate 909. As illustrated in FIG. 6A, this structure is an example of a face-up system in which the deposition target surface of the substrate faces upward. In the case of the face-up system, a large-area glass substrate which is easily warped is placed on a flat stage, or the glass substrate is supported by a plurality of pins, whereby the substrate has no warpage, and thus a deposition apparatus can be realized with which a film of a uniform thickness can be obtained over an entire surface of the substrate.

The deposition target substrate supporting means 905 is moved so that the distance between the second supporting substrate 907 and the deposition target substrate 909 is reduced to be the distance d. Note that the distance d is defined as the distance between a surface of the material layer 908 formed over the second supporting substrate 907 and a surface of the deposition target substrate 909. When some layer (e.g., a conductive layer which serves as an electrode or an insulating layer which serves as a partition wall) is formed on the deposition target substrate 909, the distance d is defined as the distance between the surface of the material layer 908 over the second supporting substrate 907 and the surface of the layer formed on the deposition target substrate 909. Note that when the surface of the deposition target substrate 909 or the surface of the layer formed on the deposition target substrate 909 is uneven, the distance d is defined as the shortest distance between the surface of the material layer 908 over the second supporting substrate 907 and the outermost surface of the deposition target substrate 909 or the outermost surface of the layer formed on the deposition target substrate 909. Although an example in which the evaporation donor substrate supporting mechanism is fixed while the deposition target substrate supporting mechanism is moved for controlling the distance between the substrates is described, a structure may also be employed in which the evaporation donor substrate supporting substrate is moved while the deposition target substrate supporting mechanism is fixed. Alternatively, both the evaporation donor substrate supporting mechanism and the deposition target substrate supporting mechanism may be moved to adjust the distance d.

As illustrated in FIG. 6A, the evaporation donor substrate is irradiated with light from the light source 910 while the distance d between the substrates is kept. Note that it is preferable that a large part of the light source 910 is opposite the evaporation donor substrate.

By irradiation of the evaporation donor substrate with light from the light source 910, the material layer 908 of the evaporation donor substrate is heated in a short time, and thus an evaporation material is deposited onto a deposition target surface (i.e., an upper surface) of the deposition target substrate 909, which is disposed to face the material layer 908. This makes it possible to drastically reduce the capacity of a chamber compared to a conventional evaporation apparatus which has a large-capacity chamber, and a small-sized deposition apparatus can be realized.

The light source 910 is not specifically limited and may be a heating means capable of uniform heating in a short time. For example, a laser or a lamp may be used. In the example illustrated in FIG. 6A, the light source 910 is fixed above the deposition target substrate 909 and deposition is performed on an upper surface of the deposition target substrate 909 immediately after the light source 910 emits light.

Figure 6B:
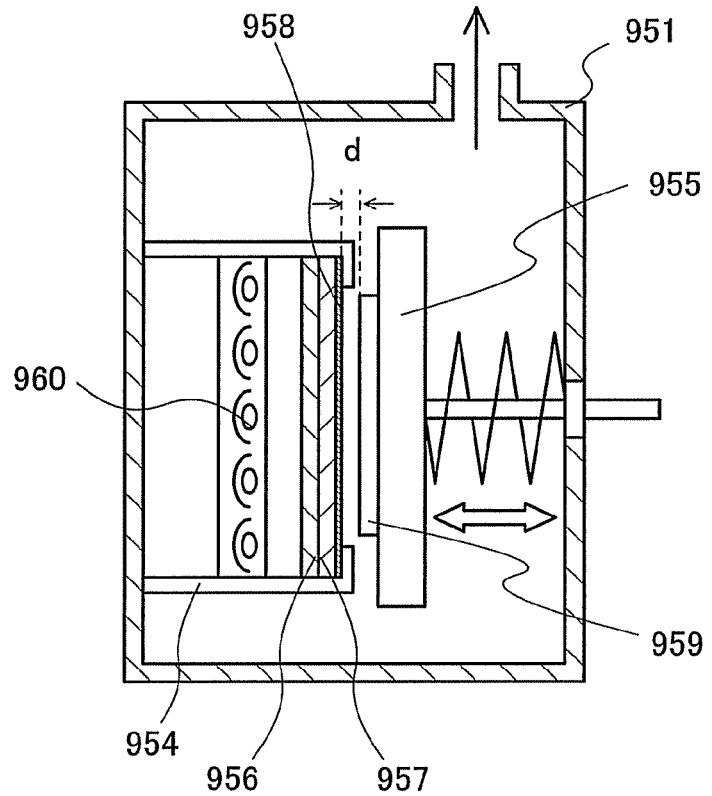

Note that although FIGS. 5A and 5B and FIG. 6A each illustrate the example of the deposition apparatus employing a system in which a substrate is horizontally placed, a deposition apparatus employing a system in which a substrate is vertically placed as illustrated in FIG. 6B can also be used.

In FIG. 6B, a deposition chamber 951 is a vacuum chamber. The deposition chamber 951 includes at least an evaporation donor substrate supporting mechanism which is an evaporation donor substrata supporting means 954, a deposition target substrate supporting mechanism which is a deposition target substrate supporting means 955, and a light source 960.

Although not illustrated, the deposition chamber 951 is connected to a first transport chamber to and from which a deposition target substrate is transported while being placed vertically. The deposition chamber 951 is also connected to a second transport chamber to and from which the evaporation donor substrate is transported while being placed vertically, which is also not illustrated. In this specification, vertical placement of a substrate refers to placement of a substrate in which a substrate surface makes a substantially right angle (ranging from 70° to 110°) with a horizontal plane. Because a large-area glass substrate or the like is easy to be warped, it is desirably transported while being placed vertically.

In addition, as the light source 960, a lamp is more suitable for heating of a large-area glass substrate than a laser.

A deposition process is as follows. First, in another deposition chamber, with the structure described in the above embodiment mode, a material layer 958 is formed over a second supporting substrate 957 provided with a light absorption layer so as to cover the light absorption layer. Note that the second supporting substrate 957 corresponds to the second supporting substrate 105 illustrated in FIGS. 1A to 1C, the material layer 958 corresponds to the material layer 109, and the first supporting substrate 956 corresponds to the first supporting substrate 101 illustrated in FIGS. 1A to 1C.

Next, the first supporting substrate 956 and the second supporting substrate 957 are transported to the deposition chamber 951 and are set on the evaporation donor substrate supporting mechanism. Here, the first supporting substrate 956 and the second supporting substrate 957 are aligned with a maker. In addition, the deposition target substrate 959 is fixed to the deposition target substrate supporting mechanism so that a surface of the second supporting substrate 957 on which the material layer 958 is formed faces a deposition target surface of the deposition target substrate 959. Note that although not illustrated, a reflective layer having an opening is provided between the first supporting substrate 956 and the second supporting substrate 957, and a light absorption layer is provided with the structure described in the above embodiment mode between the second supporting substrate 957 and the material layer 958.

Next, the evaporation donor substrate is irradiated with light from the light source 960 and is rapidly heated while the distance d between the substrates is kept. By heating the evaporation donor substrate rapidly, the material layer 958 of the evaporation donor substrate is heated in a short time by indirect heat conduction, and thus an evaporation material is deposited onto the deposition target surface of the deposition target substrate 959 disposed to face the evaporation donor substrate. This makes it possible to drastically reduce the capacity of a chamber compared to a conventional evaporation apparatus which has a large-capacity chamber, and a small-sized deposition apparatus can be realized.

In addition, a plurality of deposition apparatuses described in this embodiment mode may be provided to provide a multi-chamber deposition apparatus. Needless to say, the deposition apparatus can be combined with a deposition apparatus of another deposition method. Further, a plurality of deposition apparatuses described in this embodiment mode can be arranged in series, so that an in-line deposition apparatus can be obtained.

By using such a deposition apparatus, the light-emitting device of the present invention can be manufactured. In the present invention, an evaporation source can be easily prepared by a wet method. In addition, because the evaporation source may be evaporated as it is, a thickness monitor is not needed. Therefore, the whole deposition process can be automated, and thus throughput can be improved. Moreover, evaporation materials can be prevented from being attached to an inner wall of a deposition chamber, and thus maintenance of the deposition apparatus can be facilitated.

In addition, according to the present invention, an EL layer included in a light-emitting element can be easily formed, and also a light-emitting device including the light-emitting element can be easily manufactured. In addition, according to the present invention, patterning of a light-emitting layer can be facilitated; thus, manufacture of a light-emitting device can also be facilitated. Further, a minute pattern can be formed; thus, a high-definition light-emitting device can be obtained. Furthermore, according to the present invention, a lamp heater or the like which is inexpensive and provides a large amount of energy power can be used as an alternative to a laser as a light source. Further, the evaporation donor substrate includes two supporting substrates and by changing the positional relationship between the two supporting substrates, use efficiency of the material layer can be improved. Accordingly, manufacturing cost of a light-emitting device can be reduced.

Note that this embodiment mode can be combined with any other embodiment mode described in this specification as appropriate.

(Embodiment Mode 4)

This embodiment mode describes an example of a deposition apparatus with which a light-emitting device according to the present invention can be manufactured.

Figure 7:
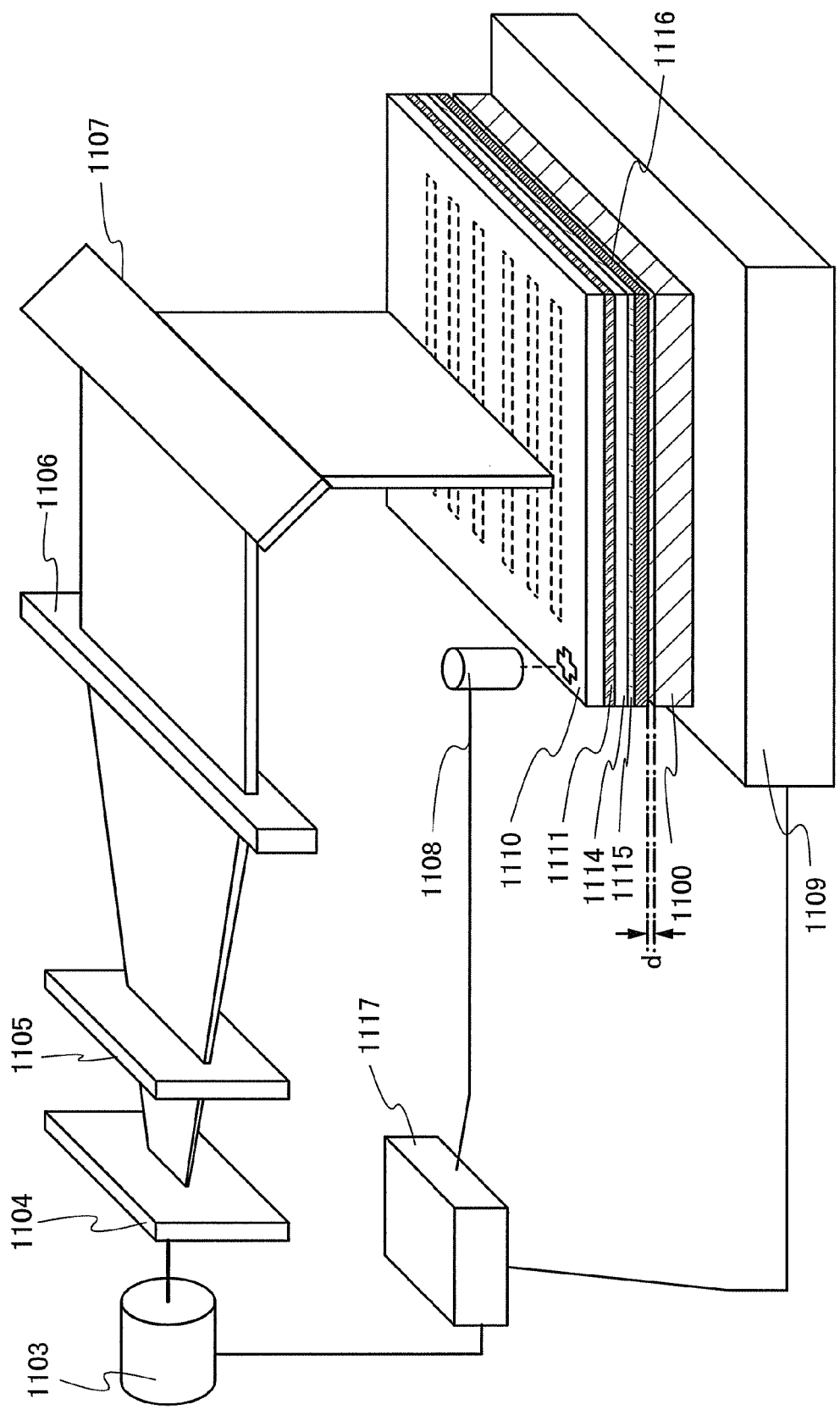
FIG. 7 illustrates an example of a deposition apparatus.

FIG. 7 is a perspective view illustrating an example of a deposition apparatus using a laser. Laser light is outputted from a laser device 1103 (a YAG laser device, an excimer laser device, or the like) and transmitted through a first optical system 1104 for changing a laser beam shape into a rectangular shape, a second optical system 1105 for shaping the laser beam, and a third optical system 1106 for collimating the laser beam; and an optical path is bent to a direction perpendicular to an evaporation donor substrate by using a reflecting mirror 1107. Then, the laser beam is delivered to the evaporation donor substrate.

For a reflective layer 1111 having an opening, a material which can withstand irradiation with laser light is used.

The shape of a laser spot with which the evaporation donor substrate is irradiated is preferably a rectangular or linear shape. Specifically, the shape may be a rectangle having a shorter side of 1 mm to 5 mm and a longer side of 10 mm to 50 mm. Furthermore, in the case of using a large-area substrate, a laser spot preferably has a longer side of 20 cm to 100 cm in order to shorten processing time. Moreover, a plurality of laser devices and optical systems illustrated in FIG. 7 may be provided to process a large-area substrate in a short time. Specifically, laser beams may be emitted from the plurality of laser devices to process separated areas of a substrate.

Note that FIG. 7 illustrates an example, and there is no particular limitation on positional relationship between each optical system and electro-optical element placed in the path of laser light. For example, a reflective mirror is not always needed if the laser device 1103 is disposed above the first supporting substrate 1110 so that laser light is emitted from the laser device 1103 in a direction perpendicular to a principle plane of the first supporting substrate 1110. Furthermore, an optical system may be a condenser lens, a beam expander, a homogenizer, a polarizer, or the like, and these may be combined. Further, an optical system may be combined with a slit.

By appropriate two-dimensional scanning over an irradiation region with a laser beam on an irradiated plane, a wide area of the substrate is irradiated. The scanning is performed by relative movement between a laser beam irradiation region and the substrate. Here, the scanning is performed with a moving means (not illustrated) for moving a substrate stage 1109 holding the substrate in X and Y directions.

A control device 1117 is preferably interlocked such that it can also control the moving means which moves the substrate stage 1109 in the X and Y directions. Furthermore, the control device 1117 is preferably interlocked such that it can also control the laser device 1103. Moreover, the control device 1117 is preferably interlocked with a positional alignment mechanism which has an imaging element 1108 for recognizing a positional alignment marker.

A positional alignment mechanism aligns the evaporation donor substrate and the deposition target substrate with each other and aligns the two supporting substrates which are included in the evaporation donor substrate with each other.

In addition, for the evaporation donor substrate irradiated with the laser beam, the evaporation donor substrate described above in Embodiment Mode 1 is used. The evaporation donor substrate includes the first supporting substrate 1110 and the second supporting substrate 1114. The first supporting substrate 1110 is provided with the reflective layer 1111, and the second supporting substrate 1114 is provided with a light absorption layer 1115, and a material layer 1116 which are stacked in that order, and evaporation donor substrate is disposed so that the surface on which these layers are formed faces the deposition target substrate 1100. For the light absorption layer 1115, a heat-resistant metal is preferably used, and for example, tungsten, tantalum, or the like is used.

The evaporation donor substrate and the deposition target substrate are brought close to face each other so that the distance d therebetween is 0 mm or more and 2 mm or less, preferably 0 mm or more and 0.05 mm or less, or more preferably 0 mm or more and 0.03 mm or less.

When deposition is performed with the deposition apparatus illustrated in FIG. 7, at least the evaporation donor substrate and the deposition target substrate are disposed in a vacuum chamber. All of the components illustrated in FIG. 7 may be placed in the vacuum chamber.

Although FIG. 7 illustrates an example of the deposition apparatus employing a so-called face-up system in which the deposition target surface of the deposition target substrate faces upward, a deposition apparatus employing a face-down system may be used. When the deposition target substrate is a large-area substrate, an apparatus employing a so-called vertical placement may also be employed in order to suppress warpage of the center of the substrate due to its own weight.

In addition when a cooling means for cooling the deposition target substrate is additionally provided, a flexible substrate such as a plastic substrate can be used as the deposition target substrate.

In addition, a plurality of deposition apparatuses described in this embodiment mode may be provided to provide a multi-chamber deposition apparatus. Needless to say, the deposition apparatus can be combined with a deposition apparatus of another deposition method. Further, a plurality of deposition apparatuses described in this embodiment mode can be arranged in series, so that an in-line deposition apparatus can be obtained.

By using such a deposition apparatus, the light-emitting device of the present invention can be manufactured. In the present invention, an evaporation source can be easily prepared by a wet method. In addition, because the evaporation source may be evaporated as it is, a thickness monitor is not needed. Therefore, the whole deposition process can be automated, and thus throughput can be improved. Moreover, evaporation materials can be prevented from being attached to an inner wall of a deposition chamber, and thus maintenance of the deposition apparatus can be facilitated.

In addition, according to the present invention, an EL layer included in a light-emitting element can be easily formed, and also a light-emitting device including the light-emitting element can be easily manufactured. In addition, according to the present invention, patterning of a light-emitting layer can be facilitated; thus, manufacture of a light-emitting device can also be facilitated. Further, a minute pattern can be formed; thus, a high-definition light-emitting device can be obtained. Further, the evaporation donor substrate includes two supporting substrates and by changing the positional relationship between the two supporting substrates, use efficiency of the material layer can be improved. Accordingly, manufacturing cost of a light-emitting device can be reduced.

Note that this embodiment mode can be combined with any other embodiment mode described in this specification as appropriate.

(Embodiment Mode 5)

This embodiment mode describes a method for manufacturing a light-emitting device and a light-emitting element according to the present invention.

Figure 8A:
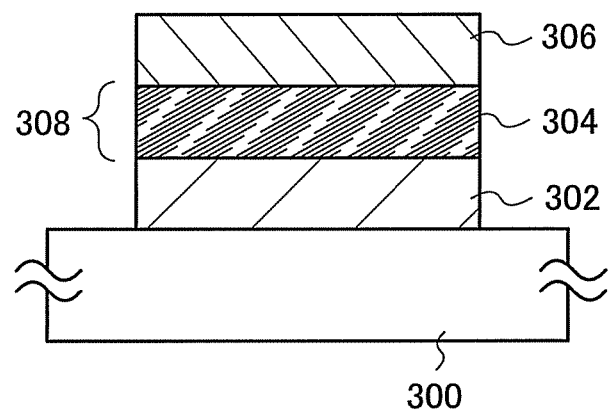
FIGS. 8A and 8B each illustrate an example of a light-emitting element.
Figure 8B:
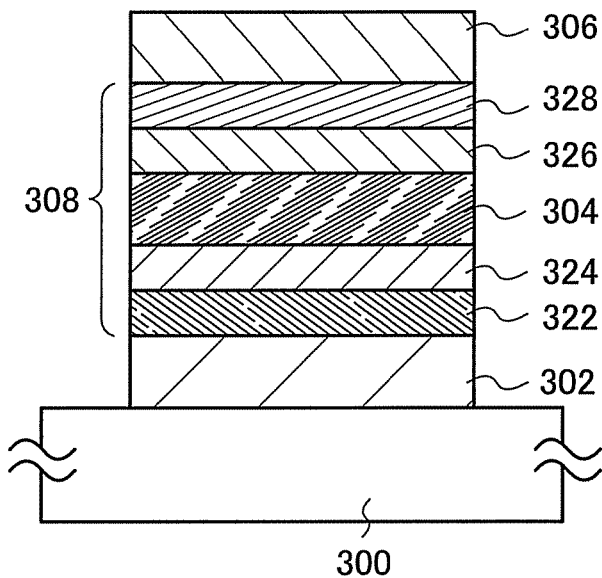

For example, light-emitting elements illustrated in FIGS. 8A and 8B can be manufactured. In the light-emitting element illustrated in FIG. 8A, a first electrode layer 302, an EL layer 308 which serves as a light-emitting layer 304, and a second electrode layer 306 are stacked in that order over a substrate 300. One of the first electrode layer 302 and the second electrode layer 306 serves as an anode, and the other serves as a cathode. Holes injected from the anode and electrons injected from the cathode are recombined in the light-emitting layer 304, whereby light can be emitted. In this embodiment mode, the first electrode layer 302 serves as the anode and the second electrode layer 306 serves as the cathode.

Further, in the light-emitting element illustrated in FIG. 8B, in addition to the components illustrated in FIG. 8A, a hole-injecting layer, a hole-transporting layer, an electron-transporting layer, and an electron-injecting layer are provided. The hole-transporting layer is provided between the anode and the light-emitting layer. In addition, the hole-injecting layer is provided between the anode and the light-emitting layer or between the anode and the hole-transporting layer. On the other hand, the electron-transporting layer is provided between the cathode and the light-emitting layer. The electron-injecting layer is provided between the cathode and the light-emitting layer or between the cathode and the electron-transporting layer. Note that not all of the hole-injecting layer, the hole-transporting layer, the electron-transporting layer, and the electron-injecting layer are necessarily provided, and a layer which is to be provided may be selected as appropriate in accordance with a desired function or the like. In FIG. 8B, the first electrode layer 302 which serves as an anode, a hole-injecting layer 322, a hole-transporting layer 324, the light-emitting layer 304, an electron-transporting layer 326, an electron-injecting layer 328 and the second electrode layer 306 which serves as a cathode, are stacked in that order over the substrate 300.

As the substrate 300, a substrate having an insulating surface or an insulating substrate is employed. Specifically, any of a variety of glass substrates used for the electronics industry such as an aluminosilicate glass substrate, an aluminoborosilicate glass substrate, or a barium borosilicate glass substrate; a quartz substrate; a ceramic substrate; a sapphire substrate; or the like can be used.

For the first electrode layer 302 and the second electrode layer 306, any of various types of metals, alloys, electrically conductive compounds, mixtures thereof, and the like can be used. Examples thereof are given below: indium tin oxide (ITO), indium tin oxide containing silicon or silicon oxide, indium zinc oxide (IZO), and indium oxide containing tungsten oxide and zinc oxide (IWZO). Films of these conductive metal oxides are generally deposited by sputtering, but they may be formed by application of a sol-gel method or the like. For example, a film of indium zinc oxide (IZO) can be formed by a sputtering method using a target in which zinc oxide is added to indium oxide at 1 wt % to 20 wt %. A film of indium oxide containing tungsten oxide and zinc oxide (IWZO) can be formed by a sputtering method using a target in which tungsten oxide and zinc oxide are added to indium oxide at 0.5 wt % to 5 wt % and 0.1 wt % to 1 wt %, respectively. Further, gold (Au), platinum (Pt), nickel (Ni), tungsten (W), chromium (Cr), molybdenum (Mo), iron (Fe), cobalt (Co), copper (Cu), palladium (Pd), nitride of a metal material (such as titanium nitride), and the like can be given. Further, aluminum (Al), silver (Ag), an alloy containing aluminum (AlSi), or the like can be used. Moreover, any of the following materials having a low work function can be used: elements which belong to Group 1 and Group 2 of the periodic table, that is, alkali metals such as lithium (Li) and cesium (Cs) and alkaline-earth metals such as magnesium (Mg), calcium (Ca), and strontium (Sr), and alloys thereof (an alloy of aluminum, magnesium, and silver, and an alloy of aluminum and lithium); rare earth metals such as europium (Eu) and ytterbium (Yb), and alloys thereof; and the like. A film of an alkali metal, an alkaline earth metal, and an alloy thereof can be formed by a vacuum evaporation method. A film of an alloy containing an alkali metal or an alkaline earth metal can be formed by a sputtering method. Further, a film of a silver paste or the like can be formed by an inkjet method or the like for the electrodes. The first electrode layer 302 and the second electrode layer 306 are not limited to a single-layer film and can be formed as a stacked-layer film.

Note that in order to extract light emitted from the light-emitting layer 304 to the outside, one or both of the first electrode layer 302 and the second electrode layer 306 are formed so as to transmit light emitted from the light-emitting layer. For example, one or both of the first electrode layer 302 and the second electrode layer 306 are formed using a conductive material having a light-transmitting property such as indium tin oxide, or formed using silver, aluminum, or the like with a thickness of several nanometers to several tens of nanometers. Alternatively, one or both of the first electrode layer 302 and the second electrode layer 306 can have a stacked-layer structure including a thin film of a metal such as silver, aluminum, or the like with a reduced thickness and a thin film of a conductive material having a light-transmitting property, such as ITO. Note that the first electrode layer 302 and the second electrode layer 306 may be formed by any of a variety of methods.

In this embodiment mode, the light-emitting layer 304, the hole-injecting layer 322, the hole-transporting layer 324, the electron-transporting layer 326, or the electron-injecting layer 328 can be formed by application of the deposition method described above in Embodiment Mode 1.

For example, when the light-emitting element illustrated in FIG. 8A is formed, an evaporation donor substrate which includes a first supporting substrate provided with a reflective layer having an opening, and a second supporting substrate provided with a light absorption layer and a material layer which serves as an evaporation source for forming a light-emitting layer is disposed close to the substrate 300 provided with the first electrode layer 302. By light irradiation, the material layer formed in the evaporation donor substrate is heated to be sublimated to form the light-emitting layer 304 over the substrate 300. Then, the second electrode layer 306 is formed over the light-emitting layer 304.

Any of a variety of materials can be used for the light-emitting layer 304. For example, a fluorescent compound which exhibits fluorescence or a phosphorescent compound which exhibits phosphorescence can be used.

Examples of a phosphorescent compound which is used for the light-emitting layer are given below. As a material for blue light emission, bis[2-(4',6'-difluorophenyl)pyridinato-N,$C^{2'}$]iridium(III)tetrakis(1-pyrazolyl)borate (abbr.: FIr6), bis[2-(4',6'-difluorophenyl)pyridinato-N,$C^{2'}$]iridium(III)picolinate (abbr.: FIrpic), bis[2-(3',5'bistrifluoromethylphenyl)pyridinato-N,$C^{2'}$]iridium(III)picolinate (abbr.: Ir(CF$_3$ppy)$_2$(pic)), bis[2-(4',6'-difluorophenyl)pyridinato-N,$C^{2'}$]iridium(III)acetylacetonate (abbr.: FIr(acac)) or the like can be given. As a material for green light emission, tris(2-phenylpyridinato-N,$C^{2'}$)iridium(III) (abbr.: Ir(ppy)$_3$), bis[2-phenylpyridinato-N,$C^{2'}$]iridium(III)acetylacetonate (abbr.: Ir(ppy)$_2$(acac)), bis(1,2-diphenyl-1H-benzimidazolato)iridium(III)acetylacetonate (abbr.: Ir(pbi)$_2$(acac)), bis(benzo[h]quinolinato)iridium(III)acetylacetonate (abbr.: Ir(bzq)$_2$(acac)), or the like can be given. As a material for yellow light emission, bis(2,4-diphenyl-1,3-oxazolato-N,$C^{2'}$)iridium(III)acetylacetonate (abbr.: Ir(dpo)$_2$(acac)), bis[2-(4'-perfluorophenylphenyl)pyridinato]iridium(III)acetylacetonate (abbr.: Ir(p-PF-ph)$_2$(acac)), bis(2-phenylbenzothiazolato-N,$C^{2'}$)iridium(III)acetylacetonate (abbr.: Ir(bt)$_2$(acac)), or the like can be given. As a material for orange light emission, tris(2-phenylquinolinato-N,$C^{2'}$)iridium(III) (abbr.: Ir(pq)$_3$), bis(2-phenylquinolinato-N,$C^2$)iridium(III)acetylacetonate (abbr.: Ir(pq)$_2$(acac)), or the like can be given. As a material for red light emission, organometallic complex such as bis[2-(2'-benzo[4,5-α]thienyl)pyridinato-N,$C^{3'}$]iridium(III)acetylacetonate (abbr.: Ir(btp)$_2$(acac)), bis(1-phenylisoquinolinato-N,C$^{2'}$)iridium(III)acetylacetonate (abbr.: Ir(piq)$_2$(acac)), (acetylacetonato)bis[2,3-bis(4-fluorophenyl)quinoxalinato]iridium(III) (abbr.: Ir(Fdpq)$_2$(acac)), (2,3,7,8,12,13,17,18-octaethyl-21H,23H-porphyrinato)platinum(II) (abbr.: PtOEP), or the like can be given. In addition, a rare earth metal complex such as tris(acetylacetonato)(monophenanthroline)terbium(III) (abbr.: Tb(acac)$_3$(Phen)), tris(1,3-diphenyl-1,3-propanedionato)(monophenanthroline)europium(III) (abbr.: Eu(DBM)$_3$(Phen)), or tris[1-(2-thenoyl)-3,3,3-trifluoroacetonato](monophenanthroline)europium(II) (abbr.: Eu(TTA)$_3$(Phen)) performs light emission (electron transition between different multiplicities) from a rare earth metal ion; therefore, such a rare earth metal complex can be used as a phosphorescent compound.

Examples of a fluorescent compound which is used for the light-emitting layer are given below. As a material for blue light emission, N,N'-bis[4-(9H-carbazol-9-yl)phenyl]-N,N'-diphenylstilbene-4,4'-diamine (abbr.: YGA2S), 4-(9H-carbazol-9-yl)-4'-(10-phenyl-9-anthryl)triphenylamine (abbr.: YGAPA), or the like can be given. As a material for green light emission, N-(9,10-diphenyl-2-anthryl)-N,9-diphenyl-9H-carbazol-3-amine (abbreviation, 2PCAPA), N-[9,10-bis(1,1'-biphenyl-2-yl)-2-anthryl]-N,9-diphenyl-9H-carbazol-3-amine (abbr.: 2PCABPhA), N-(9,10-diphenyl-2-anthryl)-N,N',N'-triphenyl-1,4-phenylenediamine (abbr.: 2DPAPA), N-[9,10-bis(1,1'-biphenyl-2-yl)-2-anthryl]-N,N',N'-triphenyl-1,4-phenylenediamine (abbr.: 2DPABPhA), 9,10-di(2-biphenylyl)-2-{N-[4-(9H-carbazol-9-yl)phenyl]-N-phenylamino}anthracene (abbr.: 2YGABPhA), N,N,9-triphenylanthracen-9-amine (abbr.: DPhAPhA), or the like can be given. As a material for yellow light emission, rubrene, 5,12-bis(1,1'-biphenyl-4-yl)-6,11-diphenyltetracene (abbr.: BPT), or the like can be given. As a material for red light emission, N,N,N',N'-tetrakis(4-methylphenyl)tetracene-5,11-diamine (abbr.: p-mPhTD), 7,13-diphenyl-N,N,N',N'-tetrakis(4-methylphenyl)acenaphtho[1,2-α]fluoranthene-3,10-diamine (abbr.: p-mPhAFD), or the like can be given.

The light-emitting layer 304 may have a structure in which a substance having a high light-emitting property (dopant material) is dispersed in another substance (host material), whereby crystallization of the light-emitting layer can be suppressed. In addition, concentration quenching which results from high concentration of the substance having a high light-emitting property can be suppressed.

As the substance in which the substance having a high light-emitting property is dispersed, when the substance having a high light-emitting property is a fluorescent compound, a substance having higher singlet excitation energy (the energy difference between a ground state and a singlet excited state) than the fluorescent compound is preferably used. When the substance having a high light-emitting property is a phosphorescent compound, a substance having higher triplet excitation energy (the energy difference between a ground state and a triplet excited state) than the phosphorescent compound is preferably used.

Examples of host materials used for the light-emitting layer are given below: 4,4'-bis[N-(1-naphthyl)-N-phenylamino]biphenyl (abbr.: NPB), tris(8-quinolinolato)aluminum(III) (abbr.: Alq), 4,4'-bis[N-(9,9-dimethylfluoren-2-yl)-N-phenylamino]biphenyl (abbr.: DFLDPBi), bis(2-methyl-8-quinolinolato)(4-phenylphenolato)aluminum(III) (abbr.: BAlq), 4,4'-di(9-carbazolyl)biphenyl (abbr.: CBP), 2-tert-butyl-9,10-di(2-naphthyl)anthracene (abbr.: t-BuDNA), and 9-[4-(9-carbazolyl)phenyl]-10-phenylanthracene (abbr.: CzPA).

As the dopant material, any of the above-mentioned phosphorescent compounds and fluorescent compounds can be used.

When the light-emitting layer has a structure in which a substance having a high light-emitting property (dopant material) is dispersed in another substance (host material), a mixed layer of a host material and a guest material may be formed as the material layer serving as an evaporation source. Alternatively, the material layer serving as an evaporation source may have a structure in which a layer containing a host material and a layer containing a dopant material are stacked. By forming the light-emitting layer using the evaporation source having such a structure, the light-emitting layer 304 contains a substance in which a light-emitting material is dispersed (host material) and a substance having a high light-emitting property (dopant material), and has a structure in which the substance having a high light-emitting property (dopant material) is dispersed in the substance in which a light-emitting material is dispersed (host material). Note that for the light-emitting layer 304, two or more kinds of host materials and a dopant material may be used, or two or more kinds of dopant materials and a host material may be used. Alternatively, two or more kinds of host materials and two or more kinds of dopant materials may be used.

In addition, in the case where the light-emitting element illustrated in FIG. 8B, in which various functional layers are stacked, is formed, the following procedure to form a functional layer over the deposition target substrate may be repeated: preparing a first supporting substrate provided with a reflective layer and a second supporting substrate provided with a light absorption layer, forming a material layer over the second supporting substrate, disposing the first and second supporting substrates close to a deposition target substrate, and heating the material layer. For example, an evaporation donor substrate provided with a material layer which serves as an evaporation source for forming a hole-injecting layer is disposed close to a deposition target substrate and the material layer is heated, whereby the hole-injecting layer 322 is formed over the deposition target substrate. The deposition target substrate here is the substrate 300 and is provided with the first electrode layer 302 in advance. Successively, a material layer which serves as an evaporation source for forming a hole-transporting layer is formed over an evaporation donor substrate, the evaporation donor substrate is disposed close to the deposition target substrate, and the material layer formed is heated, whereby the hole-transporting layer 324 is formed over the hole-injecting layer 322 over the deposition target substrate. After that, the light-emitting layer 304, the electron-transporting layer 326, and the electron-injecting layer 328 are stacked in that order in a similar manner, and then the second electrode layer 306 is formed.

The hole-injecting layer 322, the hole-transporting layer 324, the electron-transporting layer 326, or the electron-injecting layer 328 may be formed using various EL materials. Each layer may be formed using one kind of material or a composite material of plural kinds of materials. In the case where a layer is formed using a composite material, a material layer containing plural kinds of evaporation materials is formed as described above. Alternatively, a material layer is formed by stacking a plurality of material layers containing evaporation materials. Also in the case where a layer is formed using one kind of material, the deposition method described above in Embodiment Mode 1 can be applied. Each of the hole-injecting layer 322, the hole-transporting layer 324, the electron-transporting layer 326, and the electron-injecting layer 328 may have a single-layer structure or a stacked-layer structure. For example, the hole-transporting layer 324 may have a stacked-layer structure of a first hole-transporting layer and a second hole-transporting layer. In addition, the electrode layer can also be formed by the deposition method described in Embodiment Mode 1.

For example, the hole-injecting layer 322 can be formed using molybdenum oxide, vanadium oxide, ruthenium oxide, tungsten oxide, manganese oxide, or the like. Alternatively, the hole-injecting layer can be formed using a phthalocyanine-based compound such as phthalocyanine (abbr.: $H_2Pc$) or copper phthalocyanine (abbr.: CuPc), a high molecular compound such as poly(3,4-ethylenedioxythiophene)/poly(styrenesufonate) (PEDOT/PSS), or the like.

As the hole-injecting layer 322, a layer which contains a substance having a high hole-transporting property and a substance having an electron-accepting property can be used. The layer which contains a substance having a high hole-transporting property and a substance having an electron-accepting property has high carrier density and an excellent hole-injecting property. When the layer which contains a substance having a high hole-transporting property and a substance having an electron-accepting property is used as a hole-injecting layer which is in contact with an electrode that serves as an anode, any of a variety of metals, alloys, electrically conductive compounds, mixtures thereof, and the like can be used regardless of the magnitude of work function as a material of the electrode which serves as an anode.

The layer which contains a substance having a high hole-transporting property and a substance having an electron-accepting property can be formed using, for example, a stack of a layer containing a substance having a high hole-transporting property and a layer containing a substance having an electron-accepting property as an evaporation source.

Examples of the substance having an electron-accepting property which is used for the hole-injecting layer are given below: 7,7,8,8-tetracyano-2,3,5,6-tetrafluoroquinodimethane (abbr.: $F_4$-TCNQ), chloranil, and the like. Other examples are transition metal oxides. Still other examples are oxide of metal belonging to Group 4 to Group 8 of the periodic table. Specifically, vanadium oxide, niobium oxide, tantalum oxide, chromium oxide, molybdenum oxide, tungsten oxide, manganese oxide, and rhenium oxide are preferable because of their high electron-accepting properties. Among them, molybdenum oxide is especially preferable because it is stable also in the atmosphere, has a low hygroscopic property, and can be easily handled.

As the substance having a high hole-transporting property which is used for the hole-injecting layer, any of various compounds such as an aromatic amine compound, a carbazole derivative, an aromatic hydrocarbon, and a high molecular compound (such as an oligomer, a dendrimer, and a polymer) can be used. Note that it is preferable that the substance having a high hole-transporting property which is used for the hole-injecting layer be a substance having a hole mobility of $10^{-6}$ cm$^2$/Vs or higher. Note that any other substance that has a hole-transporting property higher than an electron-transporting property may be used. Specific examples of the substance having a high hole-transporting property which can be used for the hole-injecting layer are given below.

Examples of an aromatic amine compound which can be used for the hole-injecting layer are given below; 4,4'-bis[N-(1-naphthyl)-N-phenylamino]biphenyl (abbr.: NPB), N,N'-bis(3-methylphenyl)-N,N'-diphenyl-[1,1'-biphenyl]-4,4'-diamine (abbr.: TPD), 4,4',4"-tris(N,N-diphenylamino)triphenylamine (abbr.: TDATA), 4,4',4"-tris[N-(3-methylphenyl)-N-phenylamino]triphenylamine (abbr.: MTDATA), 4,4'-bis[N-(spiro-9,9'-bifluoren-2-yl)-N-phenylamino]biphenyl (abbr.: BSPB), and the like. Other examples are as follows: N,N-bis(4-methylphenyl)(p-tolyl)-N,N'-diphenyl-p-phenylenediamine (abbr.: DTDPPA), 4,4'-bis[N-(4-diphenylaminophenyl)-N-phenylamino]biphenyl (abbr.: DPAB), 4,4'-bis(N-{4-[N'-(3-methylphenyl)-N'-phenylamino]phenyl}-N-phenylamino)biphenyl (abbr.: DNTPD), 1,3,5-tris[N-(4-diphenylaminophenyl)-N-phenylamino]benzene (abbr.: DPA3B), and the like.

Specific examples of a carbazole derivative which can be used for the hole-injecting layer are given below: 3-[N-(9-phenylcarbazol-3-yl)-N-phenylamino]-9-phenylcarbazole (abbr.: PCzPCA1), 3,6-bis[N-(9-phenylcarbazol-3-yl)-N-phenylamino]-9-phenylcarbazole (abbr.: PCzPCA2), 3-[N-(1-naphthyl)-N-(9-phenylcarbazol-3-yl)amino]-9-phenylcarbazole (abbr.: PCZPCN1), and the like.

Other examples of a carbazole derivative which can be used for the hole-injecting layer are given below: 4,4'-di(N-carbazolyl)biphenyl (abbr.: CBP), 1,3,5-tris[4-(N-carbazolyl)phenyl]benzene (abbr.: TCPB), 9-[4-(10-phenyl-9-anthryl)phenyl]-9H-carbazole (abbr.: CzPA), 1,4-bis-[4-(N-carbazolyl)phenyl]-2,3,5,6-tetraphenylbenzene, and the like.

Examples of an aromatic hydrocarbon which can be used for the hole-injecting layer are given below: 2-tert-butyl-9,10-di(2-naphthyl)anthracene (abbr.: t-BuDNA), 2-tert-butyl-9,10-di(1-naphthyl)anthracene; 9,10-bis(3,5-diphenylphenyl)anthracene (abbr.: DPPA), 2-tert-butyl-9,10-bis(4-phenylphenyl)anthracene (abbr.: t-BuDBA), 9,10-di(2-naphthyl)anthracene (abbr.: DNA), 9,10-diphenylanthracene (abbr.: DPAnth), 2-tert-butylanthracene (abbr.: t-BuAnth), 9,10-bis(4-methyl-1-naphthyl)anthracene (abbr.: DMNA), 9,10-bis[2-(1-naphthyl)phenyl]-2-tert-butyl-anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, and the like. Besides, pentacene, coronene, or the like can also be used. As these aromatic hydrocarbons listed here, it is preferable that an aromatic hydrocarbon having a hole mobility of $1 \times 10^{-6}$ cm$^2$/Vs or more and having 14 to 42 carbon atoms be used.

Note that an aromatic hydrocarbon which can be used for the hole-injecting layer may have a vinyl skeleton. Examples of an aromatic hydrocarbon having a vinyl group are given below: 4,4'-bis(2,2-diphenylvinyl)biphenyl (abbr.: DPVBi), 9,10-bis[4-(2,2-diphenylvinyl)phenyl]anthracene (abbr.: DPVPA), and the like.

The hole-injecting layer can be formed by using a stack of a layer containing a substance having a high hole-transporting property and a layer containing a substance having an electron-accepting property as an evaporation source. When metal oxide is used as the substance having an electron-accepting property, it is preferable that a layer which contains the metal oxide be formed after the layer which contains a substance having a high hole-transporting property is formed over the first substrate. This is because, in many cases, metal oxide has a higher decomposition temperature or an evaporation temperature than a substance having a high hole-transporting property. The evaporation source with such a structure makes it possible to efficiently sublimate a substance having a high hole-transporting property and metal oxide. In addition, local non-uniformity of the concentration in the film formed by evaporation can be suppressed. Further, there are few kinds of solvents which allow both a substance having a high hole-transporting property and metal oxide to be dissolved or dispersed therein, and a mixed solution is not easily formed; therefore, it is difficult to directly form a mixed layer by a wet method. However, by using the deposition method of the present invention, a mixed layer which contains a substance having a high hole-transporting property and metal oxide can be easily formed.

In addition, the layer which contains a substance having a high hole-transporting property and a substance having an electron-accepting property is excellent in not only a hole-injecting property but also a hole-transporting property, and thus the above-described hole-injecting layer may be used as the hole-transporting layer.

The hole-transporting layer 324 is a layer which contains a substance having a high hole-transporting property. Examples of the substance having a high hole-transporting property are given below: an aromatic amine compound such as 4,4'-bis[N-(1-naphthyl)-N-phenylamino]biphenyl (abbr.: NPB or α-NPD), N,N'-bis(3-methylphenyl)-N,N'-diphenyl-[1,1'-biphenyl]-4,4'-diamine (abbr.: TPD), 4,4',4''-tris(N,N-diphenylamino)triphenylamine (abbr.: TDATA), 4,4',4''-tris[N-(3-methylphenyl)-N-phenylamino]triphenylamine (abbr.: MTDATA), 4,4'-bis[N-(spiro-9,9'-bifluoren-2-yl)-N-phenylamino]biphenyl (abbr.: BSPB), and the like. Most of the substances mentioned here have a hole mobility of $10^{-6}$ cm$^2$/Vs or more. Note that any other material which has a hole-transporting property higher than an electron-transporting property may be used. Note that the layer which contains a substance having a high hole-transporting property is not limited to a single layer and may be a stacked layer of two or more layers formed of the above-mentioned substances.

The electron-transporting layer 326 is a layer which contains a substance having a high electron-transporting property. Examples thereof are metal complexes having a quinoline skeleton or a benzoquinoline skeleton, such as tris(8-quinolinolato)aluminum (abbr.: Alq), tris(4-methyl-8-quinolinolato)aluminum (abbr.: Almq$_3$), bis(10-hydroxybenzo[h]quinolinato)beryllium (abbr.: BeBq$_2$), bis(2-methyl-8-quinolinolato)(4-phenylphenolato)aluminum (abbr.: BAlq), and the like. Other examples are metal complexes having an oxazole-based ligand or a thiazole-based ligand, such as bis[2-(2-hydroxyphenyl)benzoxazolato]zinc (abbr.: Zn(BOX)$_2$), bis[2-(2-hydroxyphenyl)benzothiazolato]zinc (abbr.: Zn(BTZ)$_2$), and the like. Besides metal complexes, other examples are given below: 2-(4-biphenylyl)-5-(4-tert-butylphenyl)-1,3,4-oxadiazole (abbr.: PBD), 1,3-bis[5-(p-tert-butylphenyl)-1,3,4-oxadiazol-2-yl]benzene (abbr.: OXD-7), 3-(4-biphenylyl)-4-phenyl-5-(4-tert-butylphenyl)-1,2,4-triazole (abbr.: TAZ01), bathophenanthroline (abbr.: BPhen), bathocuproine (abbr.: BCP), and the like. Most of the substances mentioned here have an electron mobility of $10^{-6}$ cm$^2$/Vs or higher. Note that any other material that has an electron-transporting property higher than a hole-transporting property may be used for the electron-transporting layer. The electron-transporting layer is not limited to a single layer and may be a stacked layer of two or more layers formed of the above-mentioned substances.

The electron-injecting layer 328 can be formed using an alkali metal compound or an alkaline earth metal compound, such as lithium fluoride (LiF), cesium fluoride (CsF), or calcium fluoride (CaF$_2$). Further, a layer in which a substance having an electron-transporting property is combined with an alkali metal or an alkaline earth metal can be employed. For example, a layer of Alq containing magnesium (Mg) can be used. Note that it is preferable that the layer in which a substance having an electron-transporting property is combined with an alkali metal or an alkaline earth metal be used as the electron-injecting layer because electrons are efficiently injected from the second electrode layer 306.

Note that there is no particular limitation on a stacked-layer structure of layers of the EL layer 308. The EL layer 308 may be formed by an appropriate combination of a light-emitting layer with a layer formed of a substance having a high electron-transporting property, a substance having a high hole-transporting property, a substance having a high electron-injecting property, a substance having a high hole-injecting property, a bipolar substance (a substance having high electron-transporting and hole-transporting properties), or the like.

Light emission is extracted to the outside through one or both of the first electrode layer 302 and the second electrode layer 306. Therefore, one or both of the first electrode layer 302 and the second electrode layer 306 have a light-transmitting property. In the case where only the first electrode layer 302 is an electrode having a light-transmitting property, light is extracted from the substrate 300 side through the first electrode layer 302. In the case where only the second electrode layer 306 is an electrode having a light-transmitting property, light is extracted from the side opposite to the substrate 300 side through the second electrode layer 306. In the case where both the first electrode layer 302 and the second electrode layer 306 are electrodes having a light-transmitting property, light is extracted from both the substrate 300 side and the side opposite to the substrate 300 side through the first electrode layer 302 and the second electrode layer 306.

Figure 9A:
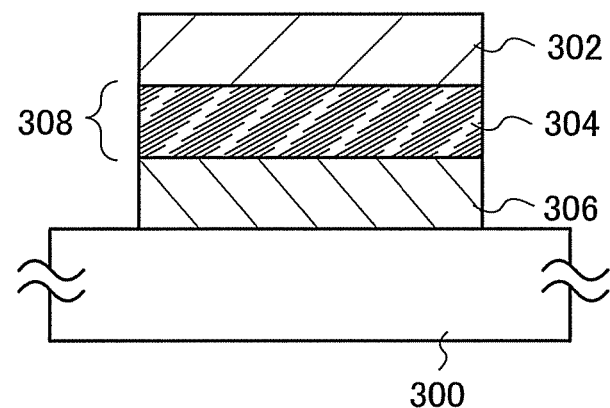
FIGS. 9A and 9B each illustrate an example of a light-emitting element.
Figure 9B:
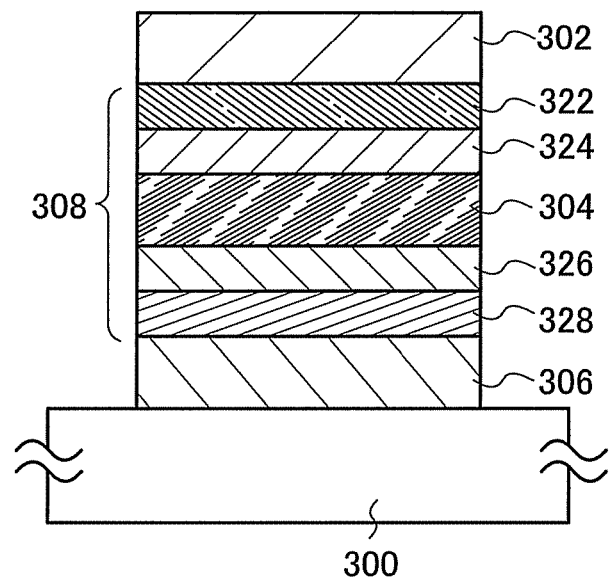

Note that although FIGS. 8A and 8B each illustrate the structure in which the first electrode layer 302 serving as an anode is provided on the substrate 300, a structure may be employed in which the second electrode layer 306 serving as a cathode, the EL layer 308, and the first electrode layer 302 serving as an anode are stacked in that order over the substrate 300, as illustrated in FIG. 9A. Alternatively, a structure may be employed in which the second electrode layer 306 serving as a cathode, the electron-injecting layer 328, the electron-transporting layer 326, the light-emitting layer 304, the hole-transporting layer 324, the hole-injecting layer 322, and the first electrode layer 302 serving as an anode are stacked in that order over the substrate 300, as illustrated in FIG. 9B.

The EL layer is formed by the deposition method described in Embodiment Mode 1 or may be formed by a combination of the deposition method described in Embodiment Mode 1 with another deposition method. A different film formation method may be used to form each electrode or each layer. Examples of a dry method are a vacuum evaporation method, an electron beam evaporation method, and a sputtering method. Examples of a wet method are an inkjet method, and a spin coating method.

Through the above-described steps, the light-emitting element can be manufactured. In the light-emitting element of this embodiment mode, functional layers including the light-emitting layer can be easily formed according to the present invention. Then, a light-emitting device can be manufactured by using such light-emitting elements. An example of a passive-matrix light-emitting device manufactured according to the present invention is described with reference to FIGS. 10A to 10C, FIG. 11, and FIG. 12.

In a passive-matrix (also called simple-matrix) light-emitting device, a plurality of anodes arranged in stripes (in a strip form) are provided so as to be perpendicular to a plurality of cathodes arranged in stripes. A light-emitting layer is interposed at each intersection. Therefore, a pixel at the intersection of the selected anode (to which voltage is applied) and the selected cathode emits light.

Figure 10A:
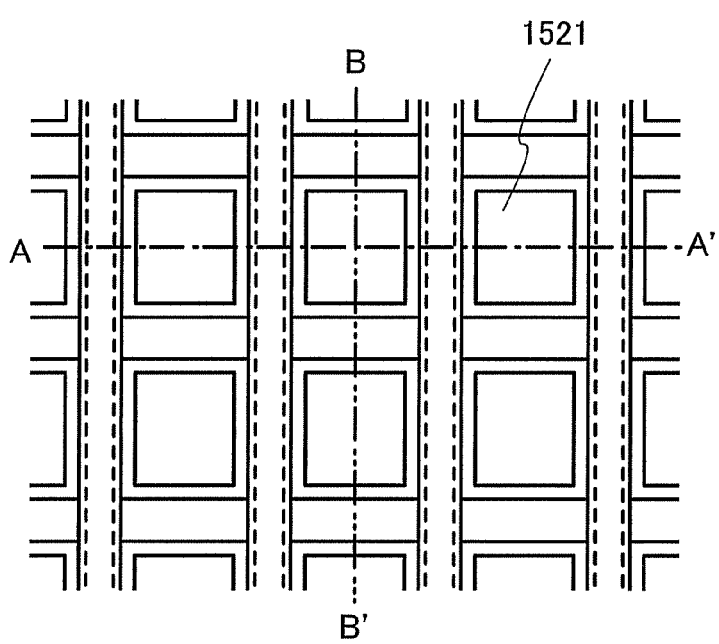
FIG. 10A is a top view of an example of a passive-matrix light-emitting device and FIGS. 10B and 10C are cross-sectional views of FIG. 10A.
Figure 10C:
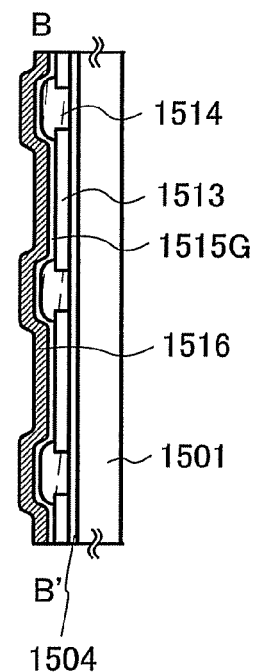
Figure 10B:
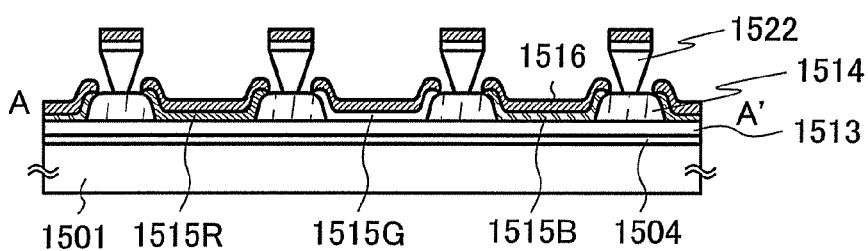

FIG. 10A is a top view of a pixel portion before sealing. FIG. 10B is a cross-sectional view taken along a dashed line A-A' in FIG. 10A. FIG. 10C is a cross-sectional view taken along a dashed line B-B' in FIG. 10A.

Over a substrate 1501, an insulating layer 1504 is formed as a base insulating layer. Note that the base insulating layer is not necessarily provided if not necessary. A plurality of first electrode layers 1513 are arranged in stripes at regular intervals over the insulating layer 1504. A partition wall 1514 having openings each corresponding to a pixel is provided over the first electrode layers 1513. The partition wall 1514 having openings is formed using an insulating material (a photosensitive or nonphotosensitive organic material (polyimide, acrylic, polyamide, polyimide amide, or benzocyclobutene) or an SOG film (such as a silicon oxide film including an alkyl group)). Note that each opening corresponding to a pixel is a light-emitting region 1521.

Over the partition wall 1514 having openings, a plurality of inversely tapered partition walls 1522 which are parallel to each other are provided to intersect with the first electrode layers 1513. The inversely tapered partition walls 1522 are formed by a photolithography method using a positive-type photosensitive resin, of which a part unexposed to light remains as a pattern, in which the amount of light exposure or the length of development time is adjusted so that a lower part of a pattern is etched more.

Figure 11:
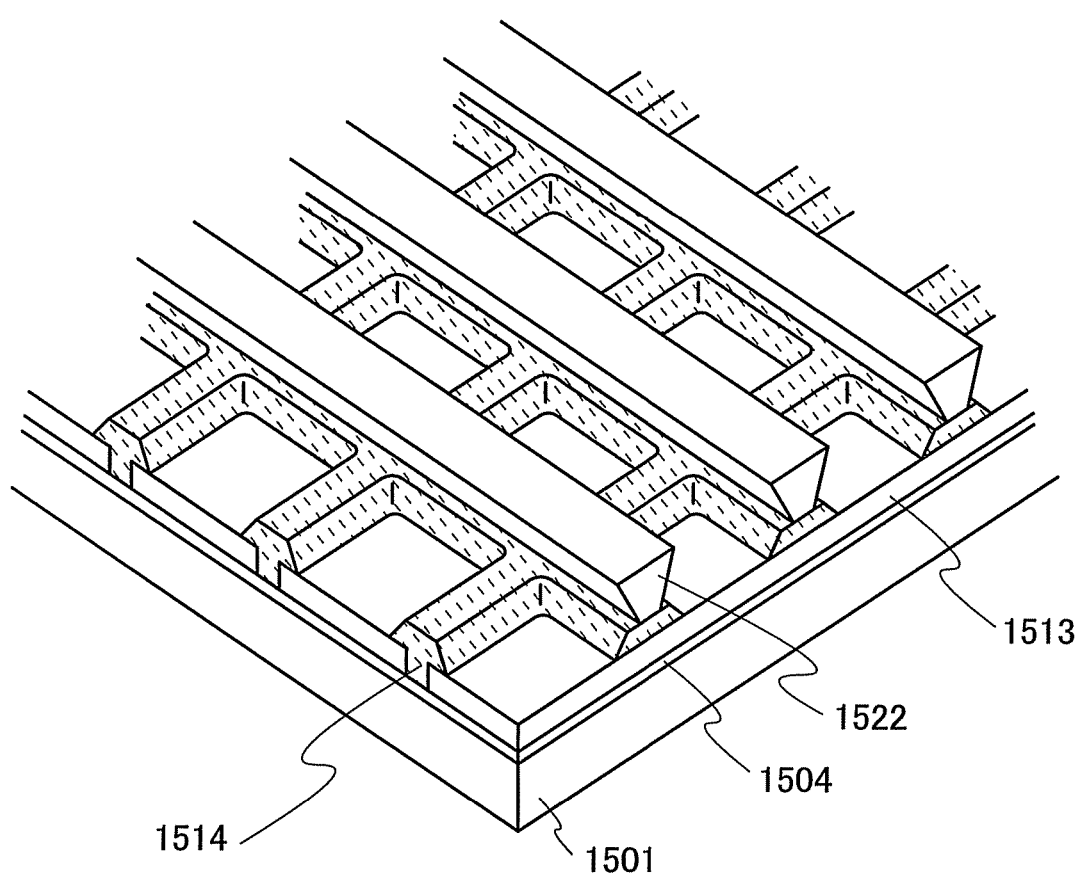
FIG. 11 is a perspective view of an example of a passive-matrix light-emitting device.

FIG. 11 is a perspective view immediately after the plurality of inversely tapered partition walls 1522 parallel to each other are formed. Note that the same reference numerals are used to denote the same portions as those in FIGS. 10A to 10C.

The total thickness of the partition wall 1514 having openings and the inversely tapered partition wall 1522 is set to be larger than the total thickness of an EL layer including a light-emitting layer and a conductive layer serving as the second electrode layer. When the EL layer including the light-emitting layer and the conductive layer are stacked over the substrate having the structure illustrated in FIG. 11, they are separated into a plurality of regions, so that EL layers 1515R, 1515G, and 1515B including the light-emitting layers, and second electrode layers 1516 are formed as illustrated in FIGS. 10A to 10C. Note that the plurality of separated regions is electrically isolated from each other. The second electrode layers 1516 are electrodes in stripes, which are parallel to each other and extended along a direction intersecting with the first electrode layers 1513. Note that although the EL layers including the light-emitting layers and the conductive layers are also formed over the inversely tapered partition walls 1522, they are separated from the EL layers 1515R, 1515G, and 1515B including the light-emitting layers, and the second electrode layers 1516. Note that in this embodiment mode, an EL layer is a layer including at least a light-emitting layer and may include a hole-injecting layer, a hole-transporting layer, an electron-transporting layer, an electron-injecting layer, or the like in addition to the light-emitting layer.

Here, an example is described in which the EL layers 1515R, 1515G, and 1515B including the light-emitting layers are selectively formed and thus a light-emitting device which provides three kinds of light emission (R, G, and B) and is capable of performing full color display is formed. The EL layers 1515R, 1515G, and 1515B including the light-emitting layers are formed in a pattern of stripes parallel to each other. These EL layers may be formed by the deposition method described above in Embodiment Mode 1. For example, a first evaporation donor substrate provided with an evaporation source for a light-emitting layer providing red light emission, a second evaporation donor substrate provided with an evaporation source for a light-emitting layer providing green light emission, and a third evaporation donor substrate provided with an evaporation source for a light-emitting layer providing blue light emission are separately prepared. In addition, a substrate provided with the first electrode layers 1513 is prepared as the deposition target substrate. Then, one of the first to third evaporation donor substrates is appropriately disposed to face the deposition target substrate, and the evaporation source formed in the evaporation donor substrate is heated to be sublimated, whereby the EL layers including the light-emitting layers are formed over the deposition target substrate.

Furthermore, if necessary, sealing is performed using a sealant such as a sealant can or a glass substrate for sealing. Here, a glass substrate is used as a sealing substrate, and a substrate and the sealing substrate are attached to each other with an adhesive material such as a sealant to seal a space surrounded by an adhesive material such as a sealant. The space that is sealed is filled with a filler or a dry inert gas. In addition, a desiccant or the like may be put between the substrate and the sealant so that reliability of the light-emitting device is increased. A small amount of moisture is removed by the desiccant, whereby sufficient drying is performed. The desiccant may be a substance which absorbs moisture by chemical adsorption, such as oxide of an alkaline earth metal as typified by calcium oxide or barium oxide. Note that a substance which adsorbs moisture by physical adsorption, such as zeolite or silica gel may alternatively be used.

Note that if the sealant is provided covering and in contact with the light-emitting element to sufficiently block the outside air, the desiccant is not necessarily provided.

Figure 12:
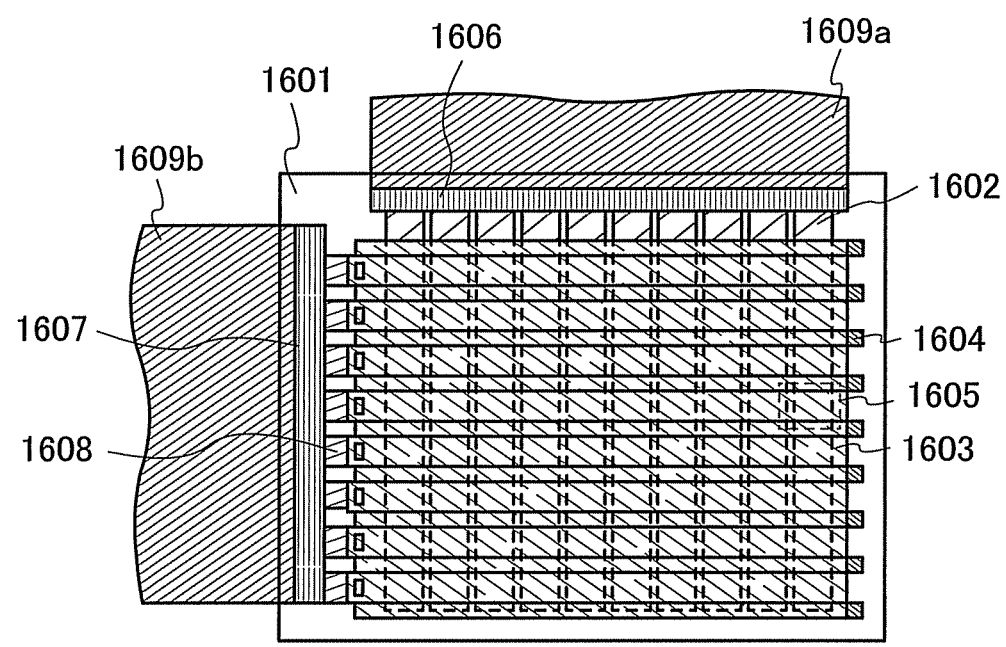
FIG. 12 is a top view of an example of a passive-matrix light-emitting device.

Next, FIG. 12 is a top view of a light-emitting module in which an FPC or the like is mounted.

Note that a light-emitting device in this specification refers to an image display device, a light-emitting device, and a light source (including an illumination device). In addition, the light-emitting device also refers to a module in which a light-emitting device is connected to a connector such as an flexible printed circuit (FPC), a tape automated bonding (TAB) tape, or a tape carrier package (TCP); a module in which a printed wiring board is provided on the tip of a TAB tape or a TCP; and a module in which an integrated circuit (IC) is directly mounted by COG bonding onto substrate provided with a light-emitting element.

As illustrated in FIG. 12, scan lines and data lines intersect with each other perpendicularly in a pixel portion 1601 for displaying images.

The first electrode layers 1513 in FIGS. 10A to 10C correspond to scan lines 1603 in FIG. 12; the second electrode layers 1516 correspond to data lines 1602; and the inversely tapered partition walls 1522 correspond to partition walls 1604. EL layers including light-emitting layers are sandwiched between the data lines 1602 and the scan lines 1603, and an intersection portion indicated by a region 1605 corresponds to one pixel.

Note that the scan line 1603 is electrically connected at the end to a connection wiring 1608, and the connection wiring 1608 is connected to an FPC 1609b through an input terminal 1607. The data line is connected to an FPC 1609a through an input terminal 1606.

If necessary, a polarizing plate, a circularly polarizing plate (including an elliptically polarizing plate), a retardation plate (a quarter-wave plate or a half-wave plate), or an optical film such as a color filter may be provided as appropriate over a light-emitting surface. Further, the polarizing plate or the circularly polarizing plate may be provided with an anti-reflection film. For example, anti-glare treatment may be carried out by which reflected light can be diffused by surface roughness so as to reduce glare.

Through the above-described steps, a passive-matrix light-emitting device can be manufactured. According to the present invention, an EL layer included in a light-emitting element can be easily formed, and also a light-emitting device including this light-emitting element can be easily manufactured. In addition, in formation of a light-emitting layer in which a dopant material is dispersed in a host material, less complicated control is needed compared to the case where co-evaporation is applied. Further, since the additive amount or the like of the dopant material is easy to control, deposition can be performed easily and accurately; therefore, a desired emission color can be obtained easily. In addition, use efficiency of an evaporation material can be increased; thus, cost reduction can also be achieved.

In addition, according to the present invention, patterning of a light-emitting layer can be facilitated; thus, manufacture of a light-emitting device can also be facilitated. Further, a minute pattern can be formed; thus, a high-definition light-emitting device can be obtained. Furthermore, according to the present invention, a lamp heater or the like which is inexpensive but provides a large amount of energy power can be used as an alternative to a laser as a light source. Accordingly, manufacturing cost of a light-emitting device can be reduced.

Although FIG. 12 illustrates the example in which a driver circuit is not provided over the substrate, the present invention is not particularly limited to this example. An IC chip including a driver circuit may be mounted on the substrate.

In the case where an IC chip is mounted, a data line side IC and a scan line side IC, in each of which a driver circuit for transmitting a signal to the pixel portion is formed, are mounted on the periphery of (outside of) the pixel portion by a COG method. The mounting may be performed using a TCP or a wire bonding method other than a COG method. A TCP is a TAB tape mounted with an IC, and the TAB tape is connected to a wiring over an element-forming substrate for mounting the IC. Each of the data line side IC and the scan line side IC may be formed using a silicon substrate. Alternatively, a driver circuit may be formed using TFTs over a glass substrate, a quartz substrate, or a plastic substrate. Although described here is an example in which a single IC is provided on one side, a plurality of ICs may be provided on one side.

Figure 13A:
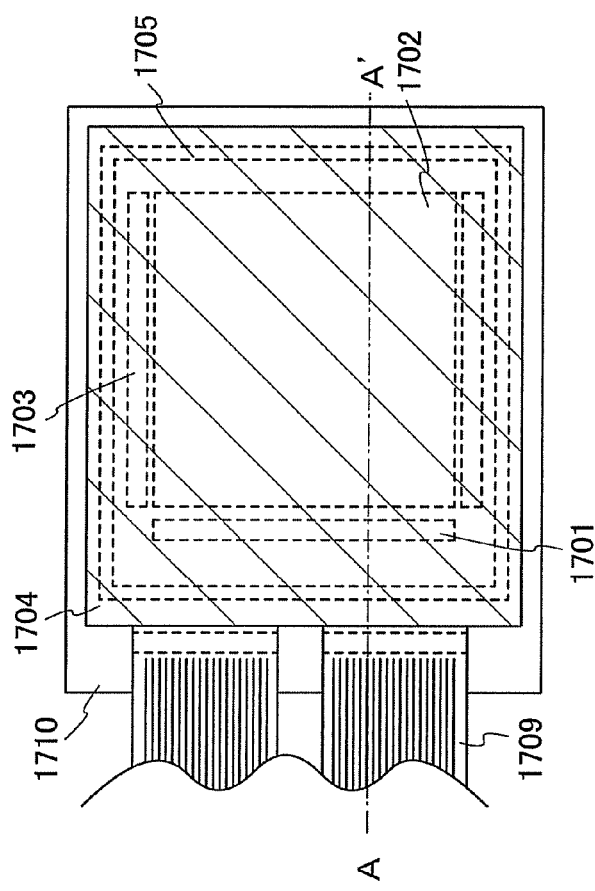
FIG. 13A is a top view of an active-matrix light-emitting device and FIG. 13B is a cross-sectional view of FIG. 13A.
Figure 13B:
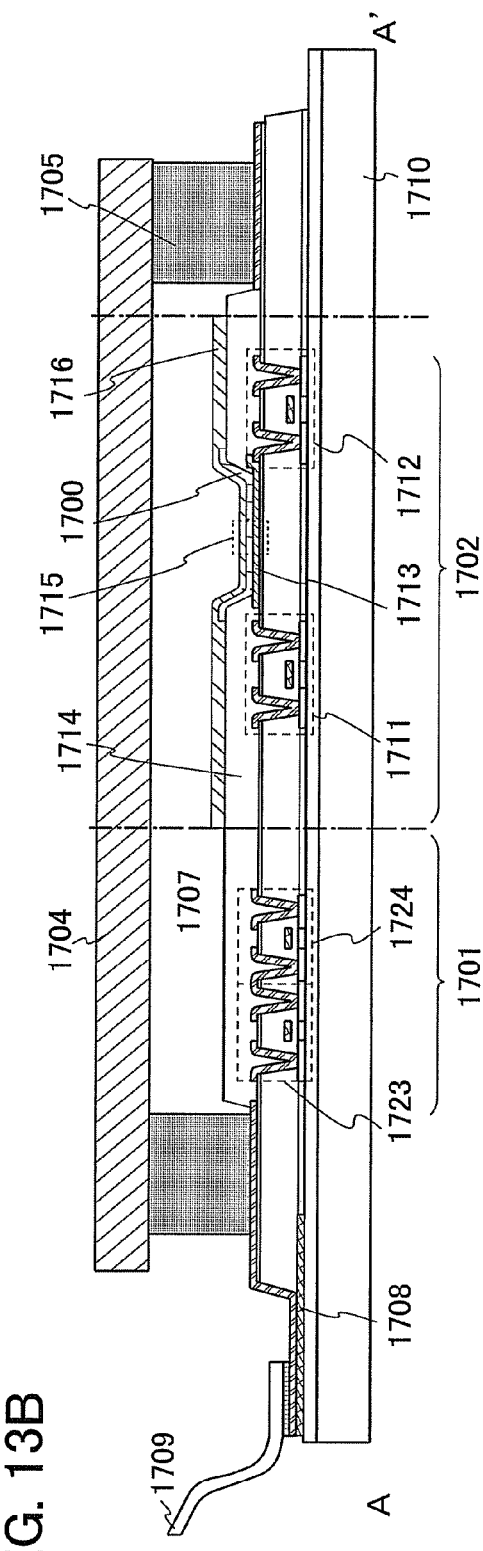

Next, an example of an active-matrix light-emitting device manufactured according to the present invention is described with reference to FIGS. 13A and 13B. Note that FIG. 13A is a top view illustrating a light-emitting device and FIG. 13B is a cross-sectional view taken along a dashed line A-A' in FIG. 13A. The active-matrix light-emitting device of this embodiment mode includes a pixel portion 1702 a driver circuit portion (a source-side driver circuit) 1701, and a driver circuit portion (a gate-side driver circuit) 1703 which are provided over an element substrate 1710. The pixel portion 1702, the driver circuit portion 1701, and the driver circuit portion 1703 are sealed, with a sealant 1705, between the element substrate 1710 and a sealing substrate 1704.

In addition, over the element substrate 1710, a lead wiring 1708 for connecting an external input terminal, through which a signal (e.g., a video signal, a clock signal, a start signal, a reset signal, or the like) or an electric potential is transmitted to the driver circuit portion 1701 and the driver circuit portion 1703 is provided. Here, an example is described in which a flexible printed circuit (FPC) 1709 is provided as the external input terminal. Note that only the FPC is illustrated here; however, the FPC may be provided with a printed wiring board (PWB). The light-emitting device in this specification includes not only the light-emitting device itself, but also the light-emitting device with an FPC or a PWB attached thereto.

Then, a cross-sectional structure is described with reference to FIG. 13B. While the driver circuit portion and the pixel portion are provided over an element substrate 1710, FIG. 13B illustrates the driver circuit portion 1701, which is the source side driver circuit portion, and the pixel portion 1702.

An example is shown in which a CMOS circuit which is a combination of an n-channel TFT 1723 and a p-channel TFT 1724 is formed as the driver circuit portion 1701. Note that a circuit included in the driver circuit portion may be formed using various CMOS circuits, PMOS circuits, or NMOS circuits. In this embodiment mode, a driver-integrated type in which a driver circuit is formed over a substrate is described; however, it is not necessarily required to have the structure, and a driver circuit can be formed not on but outside the substrate.

The pixel portion 1702 includes a plurality of pixels, each of which includes a switching TFT 1711, a current-controlling TFT 1712, and a first electrode layer 1713 which is electrically connected to a wiring (a source electrode or a drain electrode) of the current-controlling TFT 1712. Note that an insulator 1714 is formed covering an end portion of the first electrode layer 1713. In this embodiment mode, the insulator 1714 is formed using a positive photosensitive acrylic resin.

The insulator 1714 is preferably formed so as to have a curved surface with curvature at an upper end portion or a lower end portion in order to obtain favorable coverage by a film which is to be stacked over the insulator 1714. For example, in the case of using a positive photosensitive acrylic resin as a material for the insulator 1714, the insulator 1714 is preferably formed so as to have a curved surface with a curvature radius (0.2 μm to 3 μm) at the upper end portion thereof. Note that either a negative photosensitive material which becomes insoluble in an etchant by light irradiation or a positive photosensitive material which becomes soluble in an etchant by light irradiation can be used for the insulator 1714. As the insulator 1714, without limitation to an organic compound, an organic compound or an inorganic compound such as silicon oxide or silicon oxynitride can also be used.

An EL layer 1700 including a light-emitting layer and a second electrode layer 1716 are stacked over the first electrode layer 1713. The first electrode layer 1713 corresponds to the above-described first electrode layer 302, and the second electrode layer 1716 corresponds to the above-described second electrode layer 306. Note that when an ITO film is used as the first electrode layer 1713, and a stacked-layer film of a titanium nitride film and a film containing aluminum as its main component or a stacked-layer film of a titanium nitride film, a film containing aluminum as its main component, and a titanium nitride film is used as the wiring of the current-controlling TFT 1712 which is connected to the first electrode layer 1713, resistance of the wiring is low and favorable ohmic contact with the ITO film can be obtained. Note that, although not illustrated, the second electrode layer 1716 is electrically connected to the FPC 1709, which is an external input terminal.

In the EL layer 1700, at least the light-emitting layer is provided, and in addition to the light-emitting layer, a hole-injecting layer, a hole-transporting layer, an electron-transporting layer, or an electron-injecting layer is provided as appropriate. The first electrode layer 1713, the EL layer 1700, and the second electrode layer 1716 are stacked, whereby a light-emitting element 1715 is formed.

Although the cross-sectional view in FIG. 13B illustrates only one light-emitting element 1715, a plurality of light-emitting elements are arranged in matrix in the pixel portion 1702. Light-emitting elements which provide three kinds of light emissions (R, G, and B) are formed in the pixel portion 1702, whereby a light-emitting device capable of full color display can be formed. Alternatively, a light-emitting device capable of full color display may be formed by a combination with a color filter.

Furthermore, the sealing substrate 1704 and the element substrate 1710 are attached to each other with the sealant 1705, whereby the light-emitting element 1715 is provided in a space 1707 surrounded by the element substrate 1710, the sealing substrate 1704, and the sealant 1705. Note that the space 1707 may be filled with the sealant 1705 or with an inert gas (such as nitrogen or argon).

Note that an epoxy-based resin is preferably used as the sealant 1705. It is preferable that such a material transmit as little moisture and oxygen as possible. As the sealing substrate 1704, a plastic substrate formed of fiberglass-reinforced plastics (FRP), polyvinyl fluoride (PVF), polyester, acrylic, or the like can be used besides a glass substrate or a quartz substrate.

As described above, a light-emitting device can be obtained according to the present invention. An active-matrix light-emitting device tends to require high manufacturing cost per device because TFTs are manufactured; however, application of the present invention makes it possible to drastically reduce loss of materials in forming light-emitting elements. Thus, cost reduction can be achieved.

In addition, according to the present invention, an EL layer included in a light-emitting element can be easily formed, and also a light-emitting device including this light-emitting element can be easily manufactured. In addition, according to the present invention, patterning of a light-emitting layer can be facilitated; thus, manufacture of a light-emitting device can also be facilitated. Further, a minute pattern can be formed; thus, a high-definition light-emitting device can be obtained. Furthermore, according to the present invention, a lamp heater or the like which is inexpensive but provides a large amount of energy power can be used as an alternative to a laser as a light source. Accordingly, manufacturing cost of a light-emitting device can be reduced.

Note that this embodiment mode can be combined with any other embodiment mode described in this specification as appropriate.

(Embodiment Mode 6)

This embodiment mode describes various electronic devices completed using the light-emitting device manufactured according to the present invention with reference to FIGS. 14A to 14E and FIG. 15A to 15C.

Examples of electronic devices manufactured using the light-emitting device according to the present invention include televisions, cameras such as video cameras or digital cameras, goggle type displays (head mounted displays), navigation systems, audio reproducing devices (such as a car audio and an audio component), notebook computers, game machines, portable information terminals (such as a mobile computer, a cellular phone, a smart phone a portable game machine, and an electronic book reader), image reproducing devices provided with recording media (specifically, a device for reproducing a recording medium such as a digital video disc (DVD) and having a display device for displaying the reproduced image), lighting devices, and the like. Specific examples of these electronic devices are illustrated in FIGS. 14A to 14E and FIG. 15A to 15C.

Figure 14A:
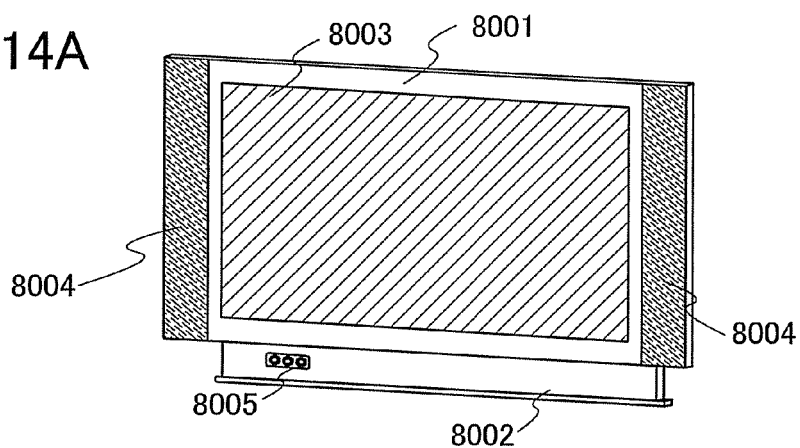
FIGS. 14A to 14E each illustrate an example of electronic devices.

FIG. 14A illustrates a display device, which includes a chassis 8001, a support 8002, a display portion 8003, a speaker portion 8004, a video input terminal 8005, and the like. The display device is manufactured by using a light-emitting device formed according to the present invention for the display portion 8003. Note that the display device includes all devices for displaying information, such as for a personal computer, for receiving TV broadcasting, and for displaying an advertisement. Since the precision of patterning in forming a light-emitting layer can be enhanced by application of the present invention, a light-emitting device having excellent characteristics can be obtained. In addition, since throughput can be improved by application of the present invention, productivity in manufacturing the display device can be improved. Moreover, since loss of materials in manufacturing the display device can be reduced, manufacturing cost can be reduced and an inexpensive display device can be provided.

Figure 14B:
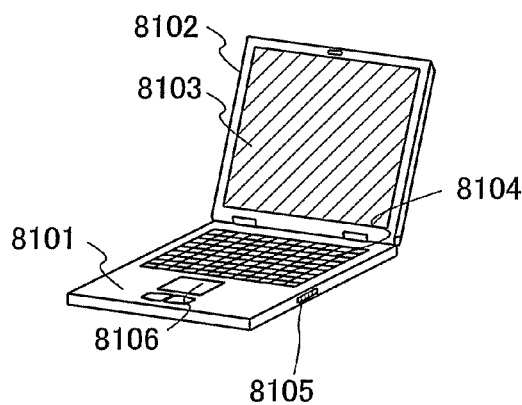

FIG. 14B illustrates a computer, which includes a main body 8101, a chassis 8102, a display portion 8103, a keyboard 8104, an external connecting port 8105, a pointing device 8106, and the like. The computer is manufactured by using a light-emitting device including a light-emitting element formed with the deposition apparatus of the present invention for the display portion 8103. Since the precision of patterning in forming a light-emitting layer can be enhanced by application of the present invention, a light-emitting device having excellent characteristics can be manufactured. In addition, since throughput can be improved by application of the present invention, productivity in manufacturing the display device can be improved. Moreover, since loss of materials in manufacturing the display device can be reduced, manufacturing cost can be reduced and an inexpensive computer can be provided.

Figure 14C:
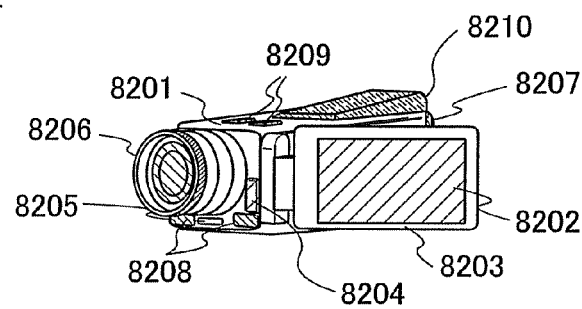

FIG. 14C illustrates a video camera, which includes a main body 8201, a display portion 8202, a chassis 8203, an external connecting port 8204, a remote control receiving portion 8205, an image receiving portion 8206, a battery 8207, an audio input portion 8208, an operation key 8209, an eye piece portion 8210, and the like. The video camera is manufactured by using a light-emitting device including a light-emitting element formed according to the present invention for the display portion 8202. Since the precision of patterning in forming a light-emitting layer can be enhanced by application of the present invention, a light-emitting device having excellent characteristics can be manufactured. In addition, since throughput can be improved by application of the present invention, productivity in manufacturing the display device can be improved. Moreover, since loss of materials in manufacturing the display device can be reduced, manufacturing cost can be reduced and an inexpensive video camera can be provided.

Figure 14D:
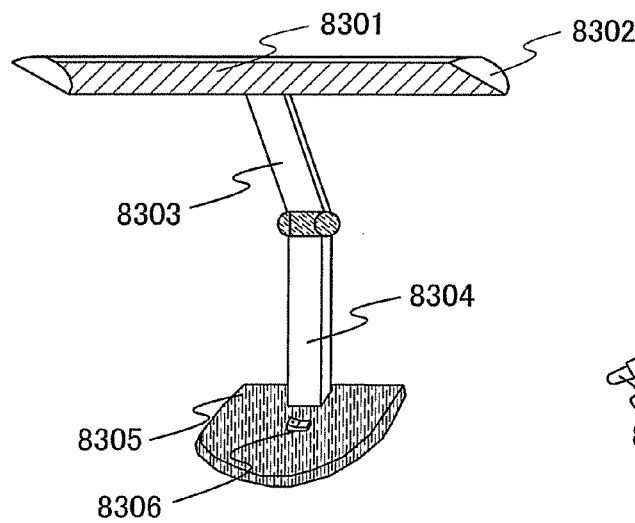

FIG. 14D illustrates a desk lamp, which includes a lighting portion 8301, a shade 8302, an adjustable arm 8303, a support 8304, a base 8305, and a power supply switch 8306. The desk lamp is manufactured by using a light-emitting device formed using the deposition apparatus of the present invention for the lighting portion 8301. Note that a lamp includes a ceiling light, a wall light, and the like in its category. Since the precision of patterning in forming a light-emitting layer can be enhanced by application of the present invention, a light-emitting device having excellent characteristics can be manufactured. In addition, since throughput can be improved by application of the present invention, productivity in manufacturing the light-emitting device can be improved. Moreover, since loss of materials in manufacturing the light-emitting device can be reduced, manufacturing cost can be reduced and an inexpensive desk lamp can be provided.

Figure 14E:
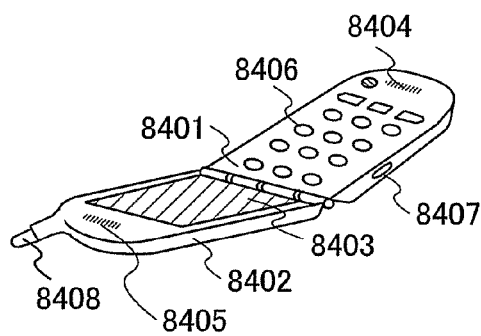

Here, FIG. 14E illustrates a cellular phone, which includes a main body 8401, a chassis 8402, a display portion 8403, an audio input portion 8404, an audio output portion 8405, an operation key 8406, an external connecting port 8407, an antenna 8408, and the like. The cellular phone is manufactured by using a light-emitting device including a light-emitting element formed using the deposition apparatus of the present invention for the lighting portion 8403. Since the precision of patterning in forming a light-emitting layer can be enhanced by application of the present invention, a light-emitting device having excellent characteristics can be manufactured. In addition, since throughput can be improved by application of the present invention, productivity in manufacturing the display device can be improved. Moreover, since loss of materials in manufacturing the display device can be reduced, manufacturing cost can be reduced and an inexpensive cellular phone can be provided.

Figure 15A:
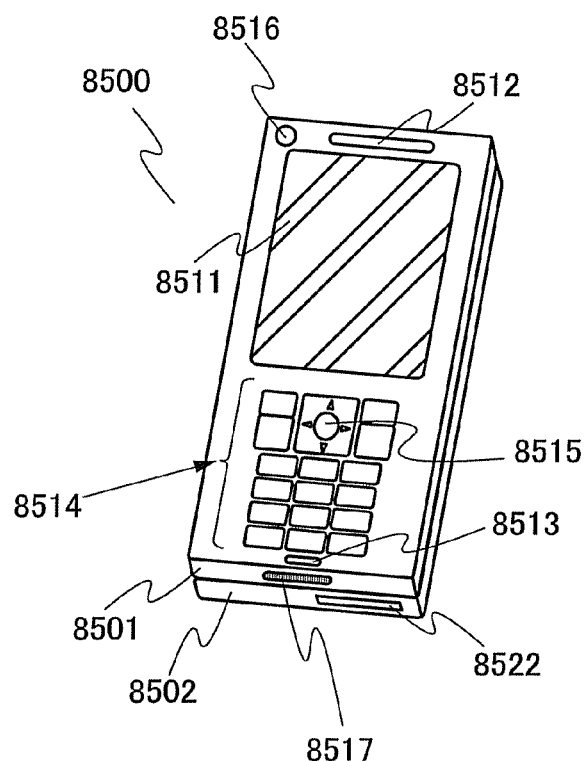
FIGS. 15A to 15C illustrate an example of electronic devices.
Figure 15B:
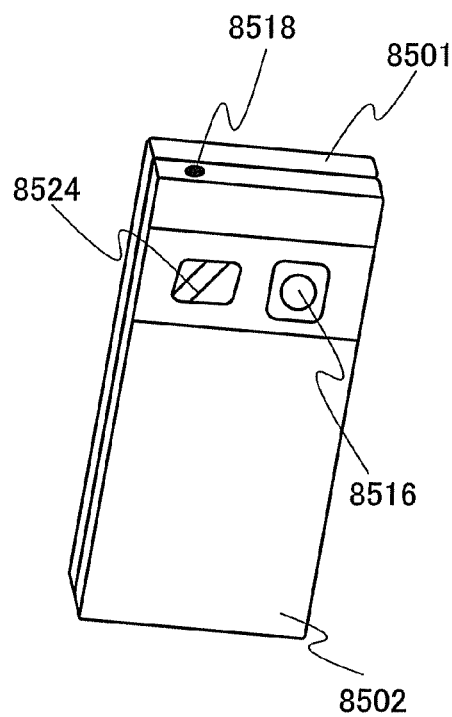
Figure 15C:
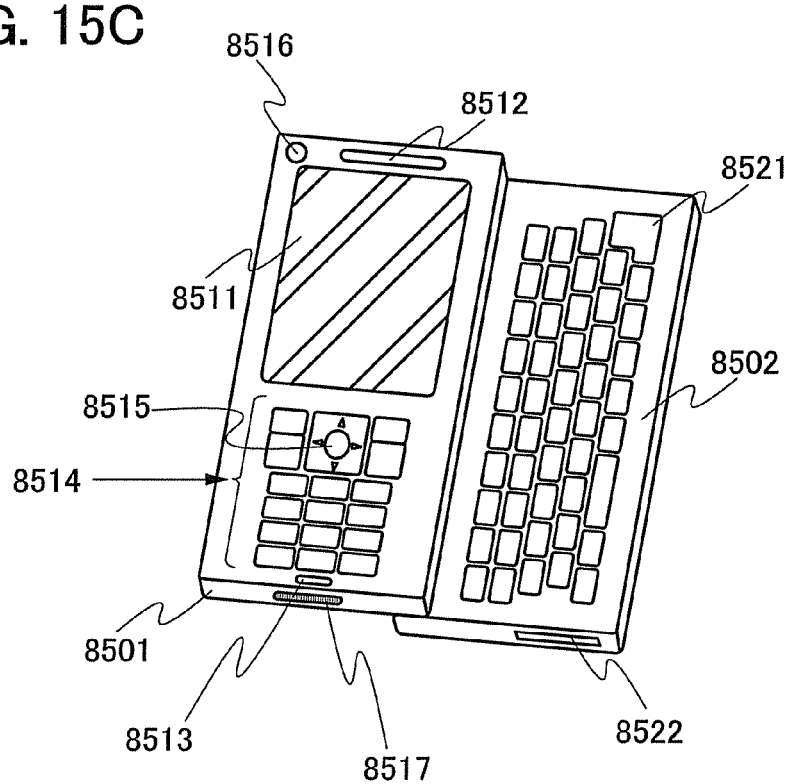

In addition, FIGS. 15A to 15C illustrate another example of a cellular phone 8500 according to the present invention. FIG. 15A is a front view, FIG. 15B is a rear view, and FIG. 15C is a development view. The cellular phone 8500 is a so-called smartphone that has both functions of a cellular phone and a portable information terminal and incorporates a computer and can process a variety of data processing in addition to voice calls.

The cellular phone 8500 has two chassis: a chassis 8501 and a chassis 8502. The chassis 8501 includes a display portion 8511, a speaker 8512, a microphone 8513, operation keys 8514, a pointing device 8515, a camera lens 8516, an external connection terminal 8517, an earphone terminal 8518, and the like. The chassis 8502 includes a keyboard 8521, an external memory slot 8522, a camera lens 8523, a light 8524, and the like. In addition, an antenna is incorporated in the chassis 8501. In the cellular phone 8500, a light-emitting device manufactured by using the deposition apparatus of the present invention is used for the display portion 8511.

Further, in addition to the above-described structure, the smartphone may incorporate a non-contact IC chip, a small size memory device, or the like.

In the display portion 8511, a display orientation can be appropriately changed according to a usage pattern. Because the camera lens 8516 is provided in the same plane as the display portion 8511, the smartphone can be used for videophone calls. Further, a still image and a moving image can be taken with the camera lens 8523 and the light 8524 using the display portion 8511 as a viewfinder. The speaker 8512 and the microphone 8513 can be used for videophone calls, recording and playing sound, etc. without being limited to voice calls. With operation keys 8514, making and receiving calls, inputting simple information such as e-mails, scrolling the screen, moving the cursor, and the like are possible. Furthermore, the chassis 8501 and the chassis 8502 (see FIG. 15A), which are overlapped with each other, are slid to expose the chassis 8502, as illustrated in FIG. 15C, and can be used as a portable information terminal. At this time, smooth operation can be conducted using the keyboard 8521 and the pointing device 8515. The external connection terminal 8517 can be connected to an AC adaptor and various types of cables such as a USB cable, and charging, data communication with a personal computer, or the like are possible. Furthermore, a large amount of data can be stored and moved by inserting a recording medium into the external memory slot 8522.

In addition to the above described functions, the smartphone may have an infrared communication function, a television receiver function, and the like.

Since the precision of patterning in forming a light-emitting layer can be enhanced according to the present invention to the cellular phone 8500, a light-emitting device having excellent characteristics can be manufactured. In addition, since throughput can be improved by application of the present invention, productivity in manufacturing the display device can be improved. Moreover, since loss of materials in manufacturing the display device can be reduced, manufacturing cost can be reduced and an inexpensive cellular phone can be provided.

As described above, an electronic device or a lighting apparatus can be obtained by using the light-emitting device of the present invention. The range of application of the light-emitting device of the present invention is wide, whereby the light-emitting device can be applied to electronic devices of a variety of fields.

Note that this embodiment mode can be combined with any other embodiment mode described in this specification as appropriate.

This application is based on Japanese Patent Application serial no. 2007-308606 filed with Japan Patent Office on Nov. 29, 2007, the entire contents of which are hereby incorporated by reference.

What is claimed:

1. A method for manufacturing a light-emitting device, comprising the steps of:
   preparing a first supporting substrate, wherein a reflective layer having an opening is formed on a front surface;
   preparing a second supporting substrate, wherein a light absorption layer patterned into an island or stripe shape and a material layer over the light absorption layer are foiled on a front surface;
   disposing the first supporting substrate and the second supporting substrate so that the opening and the light absorption layer overlap with each other, and that the reflective layer is in contact with a back surface of the second supporting substrate;
   disposing the second supporting substrate so that the front surface of the second supporting substrate faces a deposition target substrate; and
   forming an electroluminescent layer over the deposition target substrate by irradiating the back surface of the first supporting substrate with light and by heating the material layer,
   wherein a width of the opening is smaller than a width of a pattern of the light absorption layer.

2. The method for manufacturing a light-emitting device according to claim 1,
   wherein the opening is provided for every N patterns of the light absorption layer, and
   wherein N is an integer of two or more.

3. The method for manufacturing a light-emitting device according to claim 1,
   wherein the first supporting substrate, the second supporting substrate, and the deposition target substrate have the same coefficient of thermal expansion.

4. The method for manufacturing a light-emitting device according to claim 1,
   wherein the first supporting substrate, the second supporting substrate, and the deposition target substrate are formed of materials having the same properties.

5. The method for manufacturing a light-emitting device according to claim 1, wherein a thickness of the light absorption layer is 100 nm or more and 600 nm or less.

6. The method for manufacturing a light-emitting device according to claim 1,
wherein the reflective layer is formed using a material having a reflectance of 85% or more for the light with which the first supporting substrate is irradiated.

7. The method for manufacturing a light-emitting device according to claim 1,
wherein the light absorption layer is formed using a material having a reflectance of 70% or less for the light with which the first supporting substrate is irradiated.

8. The method for manufacturing a light-emitting device according to claim 1,
wherein the light with which the first supporting substrate is irradiated is infrared light.

9. The method for manufacturing a light-emitting device according to claim 1,
wherein the material layer contains an organic compound.

10. The method for manufacturing a light-emitting device according to claim 1,
wherein the material layer contains either or both a light-emitting material or a carrier-transporting material.

11. The method for manufacturing a light-emitting device according to claim 1,
wherein a first electrode is formed on the deposition target substrate, and after the material layer of the second supporting substrate is evaporated onto the first electrode of the deposition target substrate, a second electrode is formed over the deposition target substrate.

12. A method for manufacturing a light-emitting device, comprising the steps of:
preparing a first supporting substrate, wherein a reflective layer having an opening is formed on a front surface;
preparing a second supporting substrate, wherein a light absorption layer, including a first region and a second region, patterned into an island or stripe shape, and a material layer over the light absorption layer are formed on a front surface;
disposing the first supporting substrate and the second supporting substrate so that the opening and the first region of the light absorption layer overlap with each other, and the reflective layer is in contact with a back surface of the second supporting substrate;
disposing the second supporting substrate so that the front surface of the second supporting substrate faces a deposition target substrate;
irradiating the back surface of the first supporting substrate with light and evaporating a first part of the material layer onto the deposition target substrate, the first part of the material layer being contact with the first region of the light absorption layer;
disposing the first supporting substrate and the second supporting substrate so that the opening and the second region of the light absorption layer overlap with each other, and the reflective layer is in contact with the back surface of the second supporting substrate; and
irradiating the back surface of the first supporting substrate with light and evaporating a second part of the material layer onto the deposition target substrate, the second part of the material layer being contact with the second region of the light absorption layer,
wherein a width of the opening is smaller than a width of a pattern of the light absorption layer.

13. The method for manufacturing a light-emitting device according to claim 12,
wherein the opening is provided for every N patterns of the light absorption layer, and
wherein N is an integer of two or more.

14. The method for manufacturing a light-emitting device according to claim 12,
wherein the first supporting substrate, the second supporting substrate, and the deposition target substrate have the same coefficient of thermal expansion.

15. The method for manufacturing a light-emitting device according to claim 12,
wherein the first supporting substrate, the second supporting substrate, and the deposition target substrate are formed of materials having the same properties.

16. The method for manufacturing a light-emitting device according to claim 12,
wherein a thickness of the light absorption layer is 100 nm or more and 600 nm or less.

17. The method for manufacturing a light-emitting device according to claim 12,
wherein the reflective layer is formed using a material having a reflectance of 85% or more for the light with which the first supporting substrate is irradiated.

18. The method for manufacturing a light-emitting device according to claim 12,
wherein the light absorption layer is formed using a material having a reflectance of 70% or less for the light with which the first supporting substrate is irradiated.

19. The method for manufacturing a light-emitting device according to claim 12,
wherein the light with which the first supporting substrate is irradiated is infrared light.

20. The method for manufacturing a light-emitting device according to claim 12,
wherein the material layer contains an organic compound.

21. The method for manufacturing a light-emitting device according to claim 12,
wherein the material layer contains either or both a light-emitting material or a carrier-transporting material.

22. The method for manufacturing a light-emitting device according to claim 12,
wherein a first electrode is formed on the deposition target substrate, and after the material layer of the second supporting substrate is evaporated onto the first electrode of the deposition target substrate, a second electrode is formed over the deposition target substrate.

23. A method for manufacturing a light-emitting device, comprising the steps of:
disposing an evaporation donor substrate adjacent to a deposition target substrate, wherein the evaporation donor substrate comprises:
a reflective layer having an opening which is formed over a first supporting substrate;
a second supporting substrate over the reflective layer, wherein a back surface of the second supporting substrate is in contact with the reflective layer;
a light absorption layer on a front surface of the second supporting substrate, wherein the light absorption layer is an island or stripe shape; and
a material layer over the second supporting substrate and the light absorption layer,
wherein the opening is disposed at a position where the opening overlaps with the light absorption layer; and
forming an electroluminescent layer over the deposition target substrate by irradiating the back surface of the first supporting substrate with light and by heating the material layer, wherein a width of the opening is smaller than a width of a pattern of the light absorption layer.

24. The method for manufacturing a light-emitting device according to claim 23,
wherein the opening is provided for every N patterns of the light absorption layer, and
wherein N is an integer of two or more.

25. The method for manufacturing a light-emitting device according to claim 23,
wherein the first supporting substrate, the second supporting substrate, and the deposition target substrate have the same coefficient of thermal expansion.

26. The method for manufacturing a light-emitting device according to claim 23,
wherein the first supporting substrate, the second supporting substrate, and the deposition target substrate are formed of materials having the same properties.

27. The method for manufacturing a light-emitting device according to claim 23,
wherein a thickness of the light absorption layer is 100 nm or more and 600 nm or less.

28. The method for manufacturing a light-emitting device according to claim 23,
wherein the reflective layer is formed using a material having a reflectance of 85% or more for the light with which the first supporting substrate is irradiated.

29. The method for manufacturing a light-emitting device according to claim 23,
wherein the light absorption layer is formed using a material having a reflectance of 70% or less for the light with which the first supporting substrate is irradiated.

30. The method for manufacturing a light-emitting device according to claim 23,
wherein the light with which the first supporting substrate is irradiated is infrared light.

31. The method for manufacturing a light-emitting device according to claim 23,
wherein the material layer contains an organic compound.

32. The method for manufacturing a light-emitting device according to claim 23,
wherein the material layer contains either or both a light-emitting material or a carrier-transporting material.

33. The method for manufacturing a light-emitting device according to claim 23,
wherein a first electrode is formed on the deposition target substrate, and after the material layer of the second supporting substrate is evaporated onto the first electrode of the deposition target substrate, a second electrode is formed over the deposition target substrate.

34. The method for manufacturing a light-emitting device according to claim 1,
wherein the material layer is in contact with a side surface of the light absorption layer.

35. The method for manufacturing a light-emitting device according to claim 12,
wherein the material layer is in contact with a side surface of the light absorption layer.

36. The method for manufacturing a light-emitting device according to claim 23,
wherein the material layer is in contact with a side surface of the light absorption layer.

* * * * *

UNITED STATES PATENT AND TRADEMARK OFFICE
CERTIFICATE OF CORRECTION

PATENT NO. : 8,425,974 B2  
APPLICATION NO. : 12/272034  
DATED : April 23, 2013  
INVENTOR(S) : Rena Takahashi et al.

Page 1 of 1

It is certified that error appears in the above-identified patent and that said Letters Patent is hereby corrected as shown below:

In the Specification:

Column 29, lines 11-12; Change ")europium(II)" to --)europium(III)--.
Column 32, line 14; Change "PCZPCN1" to --PCzPCN1--.

In the Claims:

Column 42, line 36, Claim 1; Change "foiled" to --formed--.

Signed and Sealed this  
Thirtieth Day of July, 2013

Teresa Stanek Rea  
*Acting Director of the United States Patent and Trademark Office*

UNITED STATES PATENT AND TRADEMARK OFFICE
CERTIFICATE OF CORRECTION

| | | |
|---|---|---|
| PATENT NO. | : 8,425,974 B2 | Page 1 of 1 |
| APPLICATION NO. | : 12/272034 | |
| DATED | : April 23, 2013 | |
| INVENTOR(S) | : Takahashi et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 894 days.

Signed and Sealed this
Sixteenth Day of December, 2014

Michelle K. Lee
*Deputy Director of the United States Patent and Trademark Office*